United States Patent
Dutta et al.

(10) Patent No.: US 8,385,132 B2
(45) Date of Patent: Feb. 26, 2013

(54) ALTERNATE BIT LINE BIAS DURING PROGRAMMING TO REDUCE CHANNEL TO FLOATING GATE COUPLING IN MEMORY

(75) Inventors: Deepanshu Dutta, Santa Clara, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 84 days.

(21) Appl. No.: 12/976,893

(22) Filed: Dec. 22, 2010

(65) Prior Publication Data

US 2012/0163083 A1 Jun. 28, 2012

(51) Int. Cl.
*G11C 16/04* (2006.01)
(52) U.S. Cl. ......... 365/185.28; 365/185.14; 365/185.19; 365/185.22
(58) Field of Classification Search ............. 365/185.28, 365/185.17, 185.19, 185.22, 185.14
See application file for complete search history.

(56) References Cited

U.S. PATENT DOCUMENTS

| | | | | |
|---|---|---|---|---|
| 6,046,939 | A * | 4/2000 | Noda et al. | 365/185.09 |
| 6,108,238 | A * | 8/2000 | Nakamura et al. | 365/185.22 |
| 6,847,550 | B2 * | 1/2005 | Park | 365/185.03 |
| 7,023,733 | B2 | 4/2006 | Guterman et al. | |
| 7,239,551 | B2 | 7/2007 | Cernea et al. | |
| 7,349,263 | B2 * | 3/2008 | Kim et al. | 365/185.19 |
| 7,499,338 | B2 | 3/2009 | Ito | |
| 7,692,971 | B2 | 4/2010 | Moschiano et al. | |
| 8,050,101 | B2 * | 11/2011 | Park et al. | 365/185.22 |
| 2005/0057967 | A1 | 3/2005 | Khalid et al. | |
| 2006/0227614 | A1 | 10/2006 | Cernea et al. | |
| 2006/0285392 | A1 | 12/2006 | Incarnati et al. | |
| 2007/0153594 | A1 | 7/2007 | Chen | |
| 2007/0195597 | A1 | 8/2007 | Park et al. | |
| 2008/0019188 | A1 | 1/2008 | Li | |
| 2010/0259993 | A1 | 10/2010 | Kang | |

OTHER PUBLICATIONS

International Search Report & The Written Opinion of the International Searching Authority dated Apr. 23, 2012, International Application No. PCT/US2011/056144.

* cited by examiner

*Primary Examiner* — Pho M Luu
(74) *Attorney, Agent, or Firm* — Vierra Magen Marcus & DeNiro LLP

(57) ABSTRACT

In a non-volatile storage system, capacitive coupling effects are reduced by reducing the probability that adjacent storage elements reach the lockout condition at close to the same program pulse. A slow down measure such as an elevated bit line voltage is applied to the storage elements of a word line which are associated with odd-numbered bit lines, but not to the storage elements associated with even-numbered bit lines. The elevated bit line voltage is applied over a range of program pulses, then stepped down to ground over one or more program pulses. The range of programming pulses over which the slow down measure is applied, can be fixed or determined adaptively. A program pulse increment can be dropped, then increased, when the bit line voltage is stepped down. Storage elements which are programmed to a highest target data state can be excluded from the slow down measure.

26 Claims, 18 Drawing Sheets

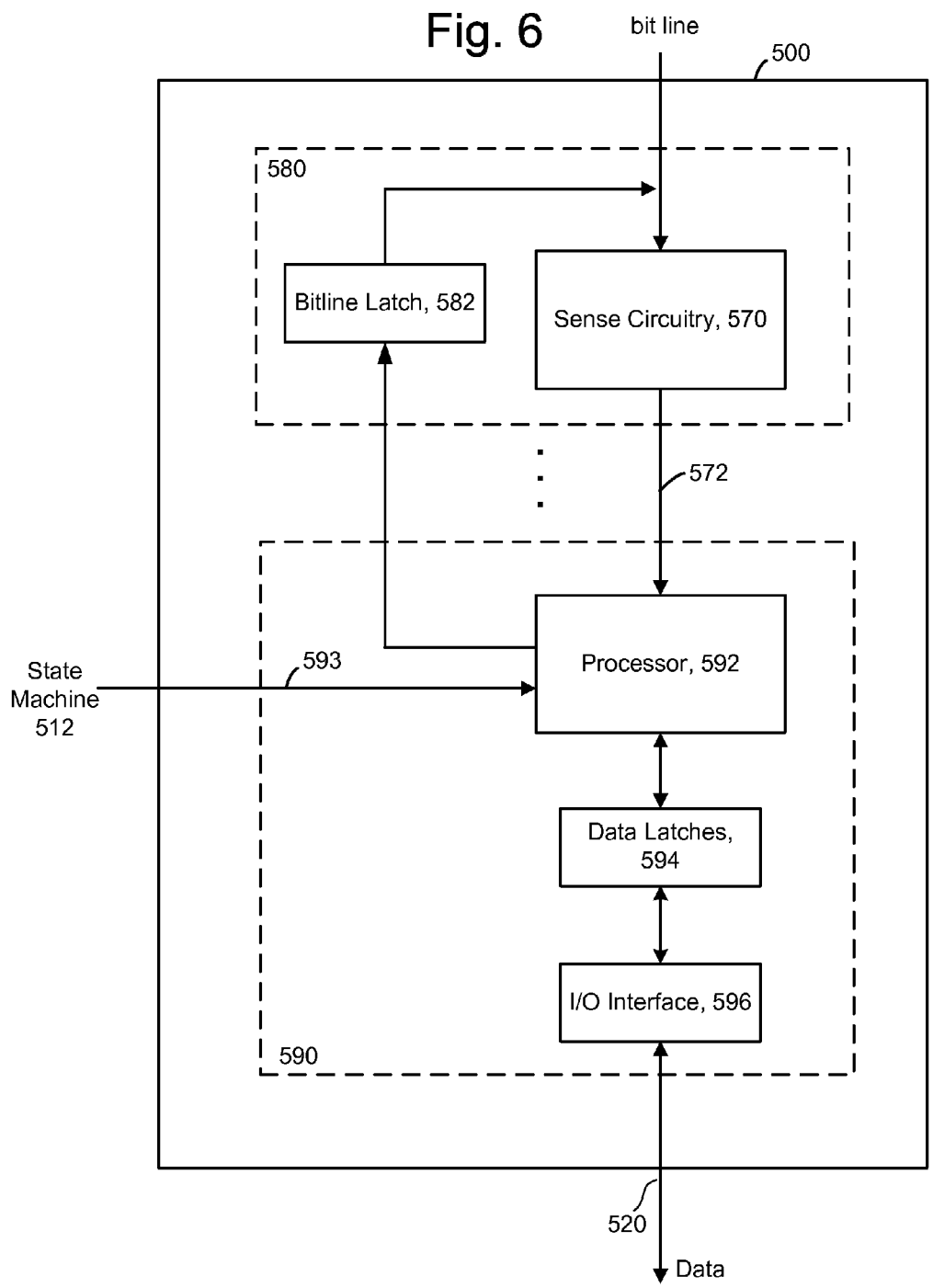

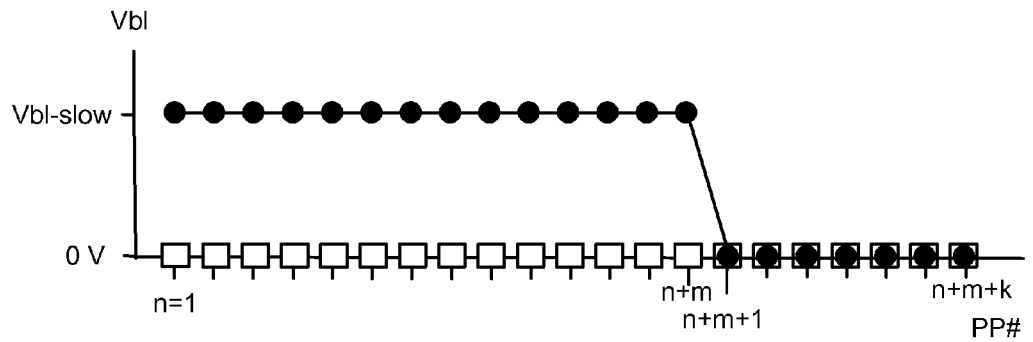
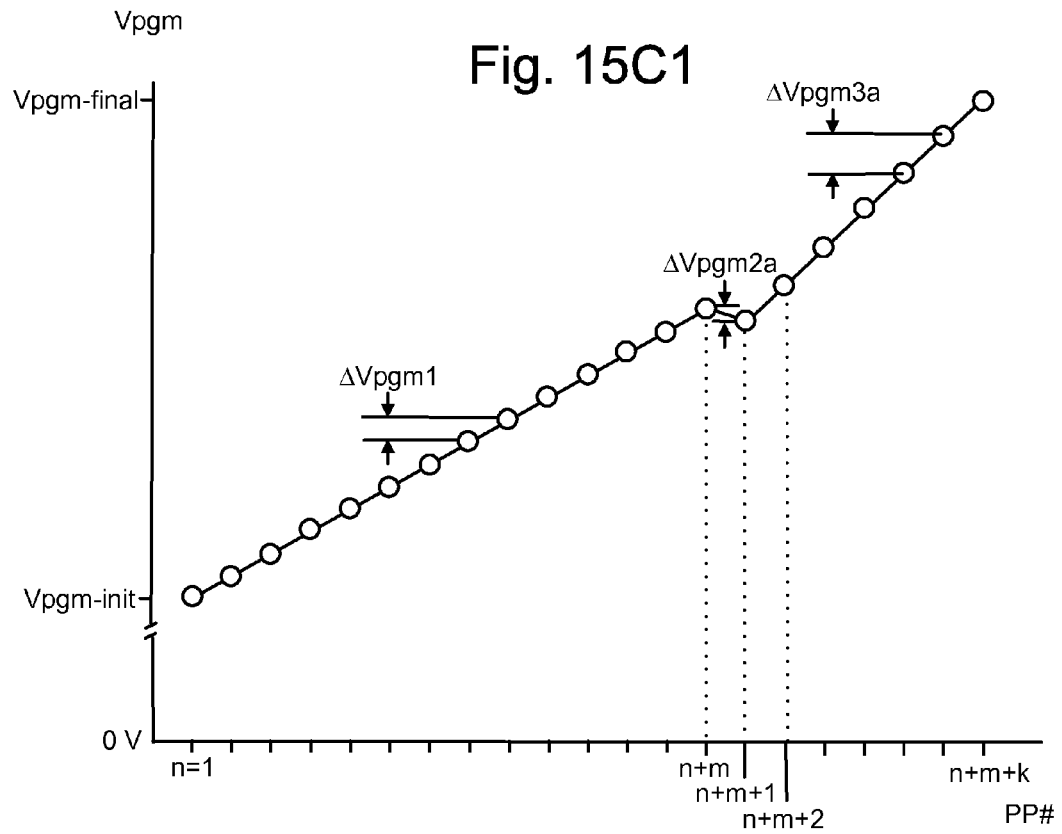

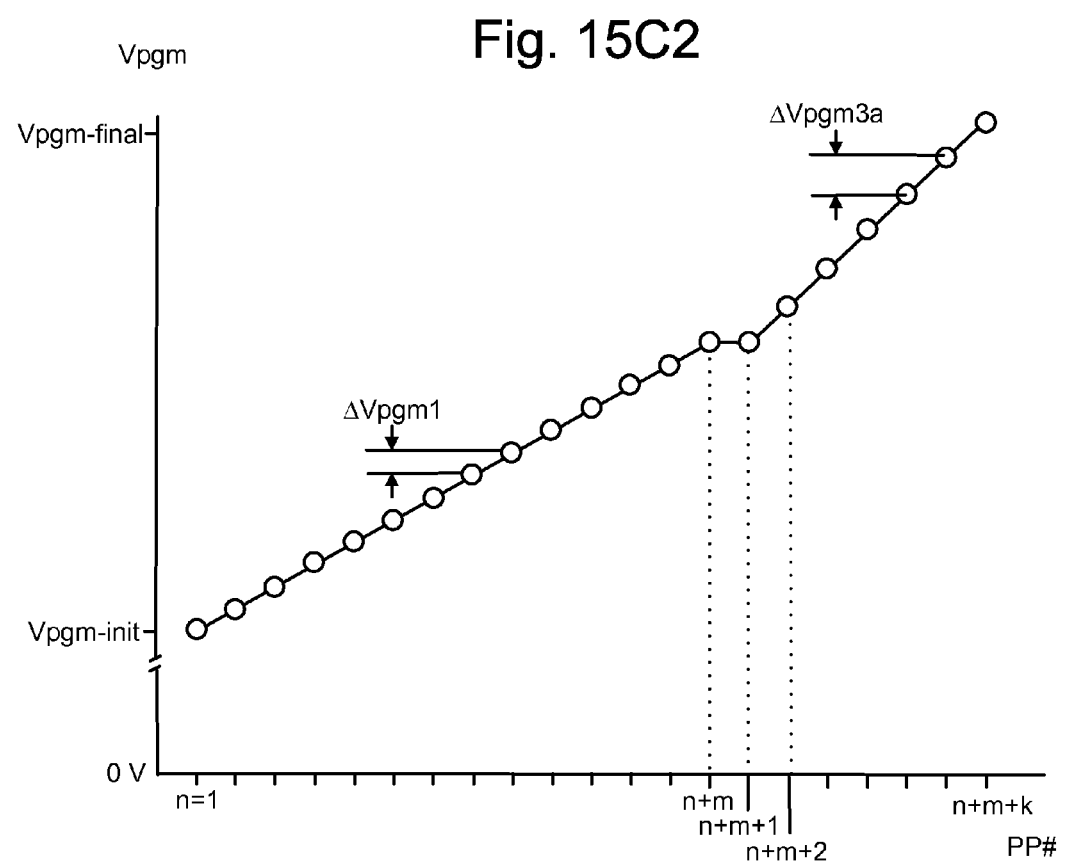

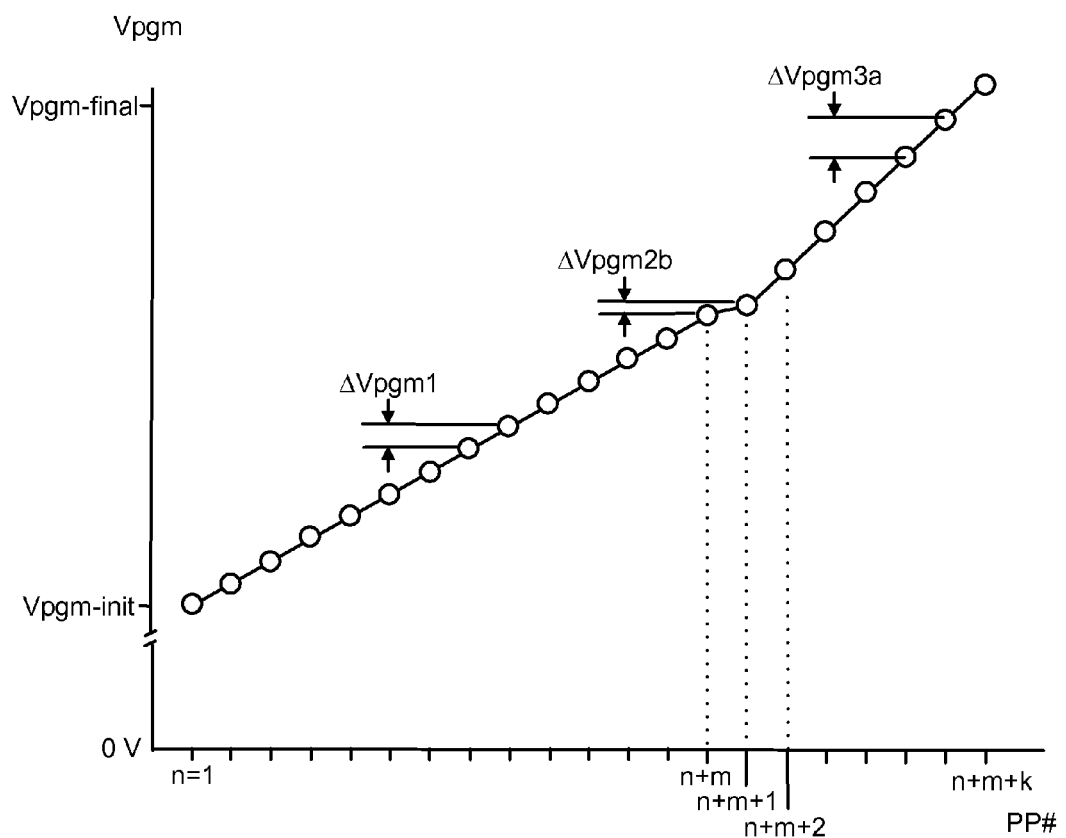
Fig. 15C3

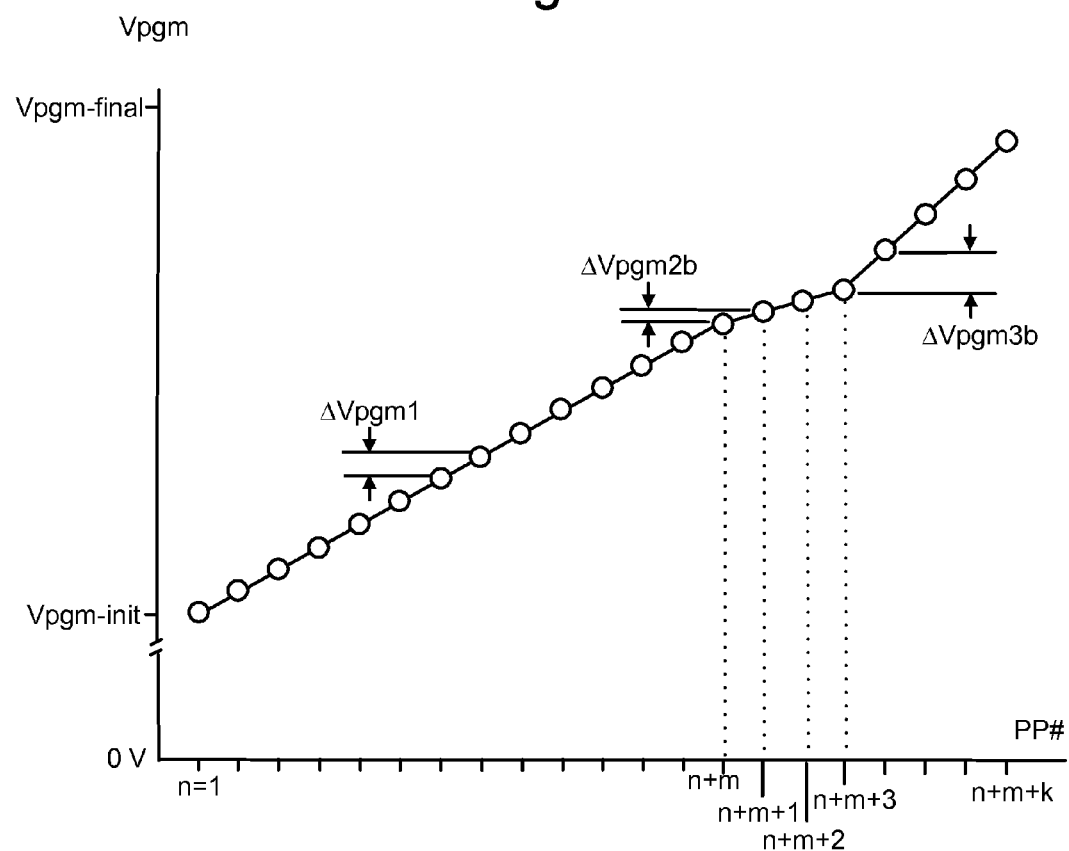

ALTERNATE BIT LINE BIAS DURING PROGRAMMING TO REDUCE CHANNEL TO FLOATING GATE COUPLING IN MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size or increment, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, electromagnetic coupling effects in memory devices are becoming increasingly important as memory device dimensions are scaled down.

BRIEF DESCRIPTION OF THE DRAWINGS

In the drawings, like-numbered elements correspond to one another.

FIG. 6 is a block diagram depicting one embodiment of a sense block.

FIG. 15B depicts bit line voltages applied to even-numbered bit lines, for which no position-based slowdown measure is applied, and to odd-numbered bit lines, for which a position-based slowdown measure is applied, where the position-based slow down measure is removed before a programming operation is completed.

FIG. 15C1 depicts a program pulse voltage versus program pulse number for use with the bit line voltages of FIG. 15B, where the program pulse voltage initially steps up at a first rate, then steps down for one program pulse at a second rate when the position-based slow down measure is removed, and then steps up at a third rate, higher than the first rate.

FIG. 15C2 depicts a program pulse voltage versus program pulse number for use with the bit line voltages of FIG. 15B, where the program pulse voltage initially steps up at a first rate, then is fixed for one program pulse when the position-based slow down measure is removed, and then steps up at a second rate, higher than the first rate.

FIG. 15C3 depicts a program pulse voltage versus program pulse number for use with the bit line voltages of FIG. 15B, where the program pulse voltage initially steps up at a first rate, then steps up for one program pulse at a second rate, lower than the first rate, when the position-based slow down measure is removed, and then steps up at a third rate, higher than the first rate.

FIG. 15D depicts a program pulse voltage versus program pulse number for use with the bit line voltages of FIG. 15E, where the program pulse voltage initially steps up at a first rate, then steps up for three program pulses at a second rate, lower than the first rate, when the position-based slow down measure is removed, and then steps up at a third rate, higher than the first rate.

DETAILED DESCRIPTION

A method and non-volatile storage system are provided in which programming is optimized to reduce electromagnetic coupling effects.

During a programming operation, unselected storage elements which have previously completed programming to a target data state are inhibited or locked out from further programming by boosting associated substrate channel regions. A sufficient amount of boosting is used to reduce the occurrence of program disturb of inhibited storage elements in which their threshold voltages are raised to a next higher data state, or to a level at which the storage element cannot be accurately read. However, channel boosting results in electromagnetic coupling effects which can raise the threshold voltages of the selected storage elements excessively, resulting in undesirable widening of the threshold voltage distributions.

It has been determined that one or more program-verify iterations which immediately follow a program-verify iteration in which a storage element is locked out, are most critical. In particular, a selected storage element is subject to a maximum coupling effect in a program-verify iteration if both adjacent neighbor storage elements reached the lockout condition in the previous program-verify iteration. Moreover, if the selected storage element reaches the lockout condition in this program-verify iteration in which it is subject to the maximum coupling effects, undesirable widening of the threshold voltage distribution is caused. By reducing the probability that this scenario will occur, the probability that undesirable widening of the threshold voltage distribution will occur is also reduced. Example implementations slow down the programming speed of storage elements associated with odd-numbered bit lines to achieve this goal. The slow down measure can involve applying an elevated bit line voltage over a range of program pulses, then stepping down the bit line voltage back to ground over one or more program pulses. The range of programming pulses can be fixed or determined adaptively. Also, storage elements which are programmed to a highest target data state can be excluded from the slow down measure since some Vth widening on the upper tail for these storage elements can often be tolerated.

Figure 1A:
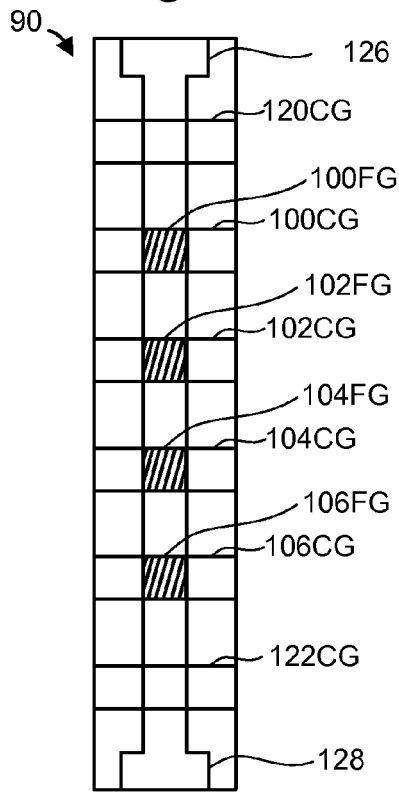
FIG. 1A is a top view of a NAND string.
Figure 1B:
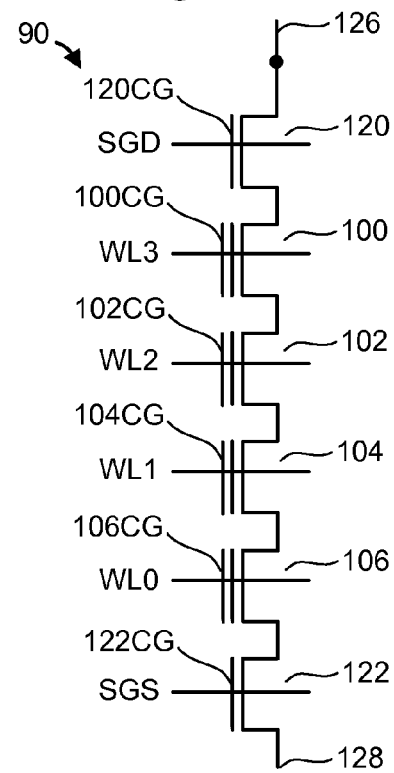
FIG. 1B is an equivalent circuit diagram of the NAND string.

One example of a suitable memory system uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively.

Figure 2:
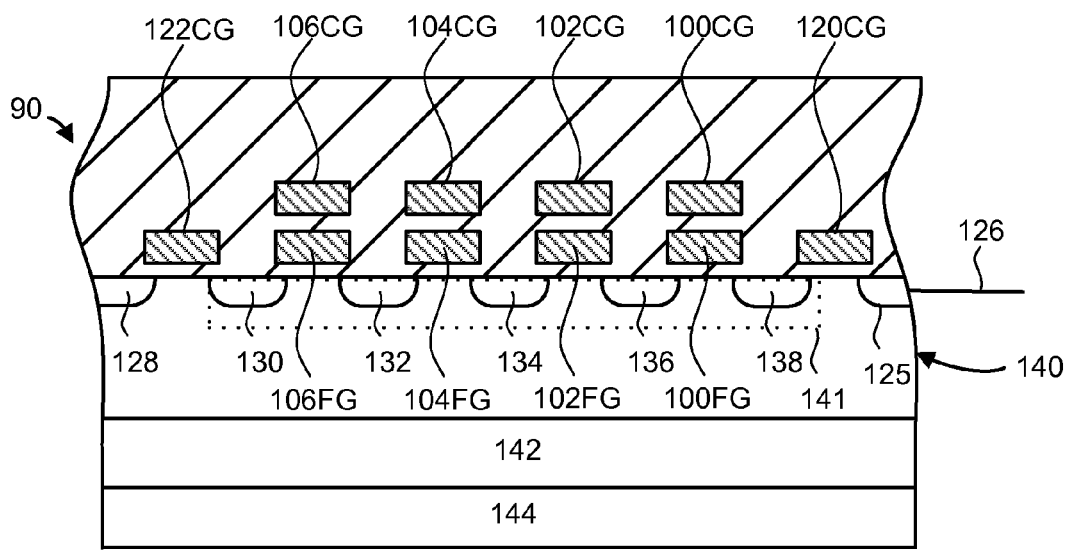
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Some NAND strings will include 8, 16, 32, 64 or more memory cells. Each memory cell can store data represented in analog or digital form, in one or more bits.

Other types of non-volatile memory in addition to NAND flash memory can also be used.

As part of a programming operation, the potential of a channel region of the substrate which is associated with an unselected storage element and, e.g., an unselected NAND string 90, can be boosted. An unselected storage element or NAND string may be referred to as an inhibited or locked out storage element or NAND string, respectively, as it is inhibited or locked out from programming in a given programming iteration of a programming operation. For example, channel region 141 may be provided in the p-well 140 of the substrate 144 when any of the storage elements which are provided by control gates and floating gates 100CG/100FG, 102CG/100FG, 104CG/104FG and 106CG/106FG is an unselected storage element in a programming operation, e.g., when the NAND string 90 is an unselected NAND string. The channel region 141 represents a conductive path in the substrate, extending in and between the doped regions 130, 132, 134, 136 and 138. Boosting can be achieved in different ways. For example, in a pre-charge operation, which occurs before a pass voltage is applied to an unselected word line, a voltage supplied on the bit line 126 can be passed to the channel 141 via the drain-side select gate transistor 120CG. In one possible scenario, with an appropriate bit line voltage, the drain-side select gate transistor provides a voltage of Vcg-Vth to the channel, where Vcg is the control gate voltage, and Vth is the threshold voltage, of the drain-side select gate transistor. The drain-side select gate transistor may subsequently be rendered non-conductive so that the bit line is cutoff from the channel 141, and the boosted potential is maintained in the channel. Channel boosting can also be achieved by applying pass voltages to the word line and maintaining the drain-side select gate transistor non-conductive. The pass voltages couple to the channel, raising its potential. Various channel boosting schemes are discussed in detail further below.

Figure 3:
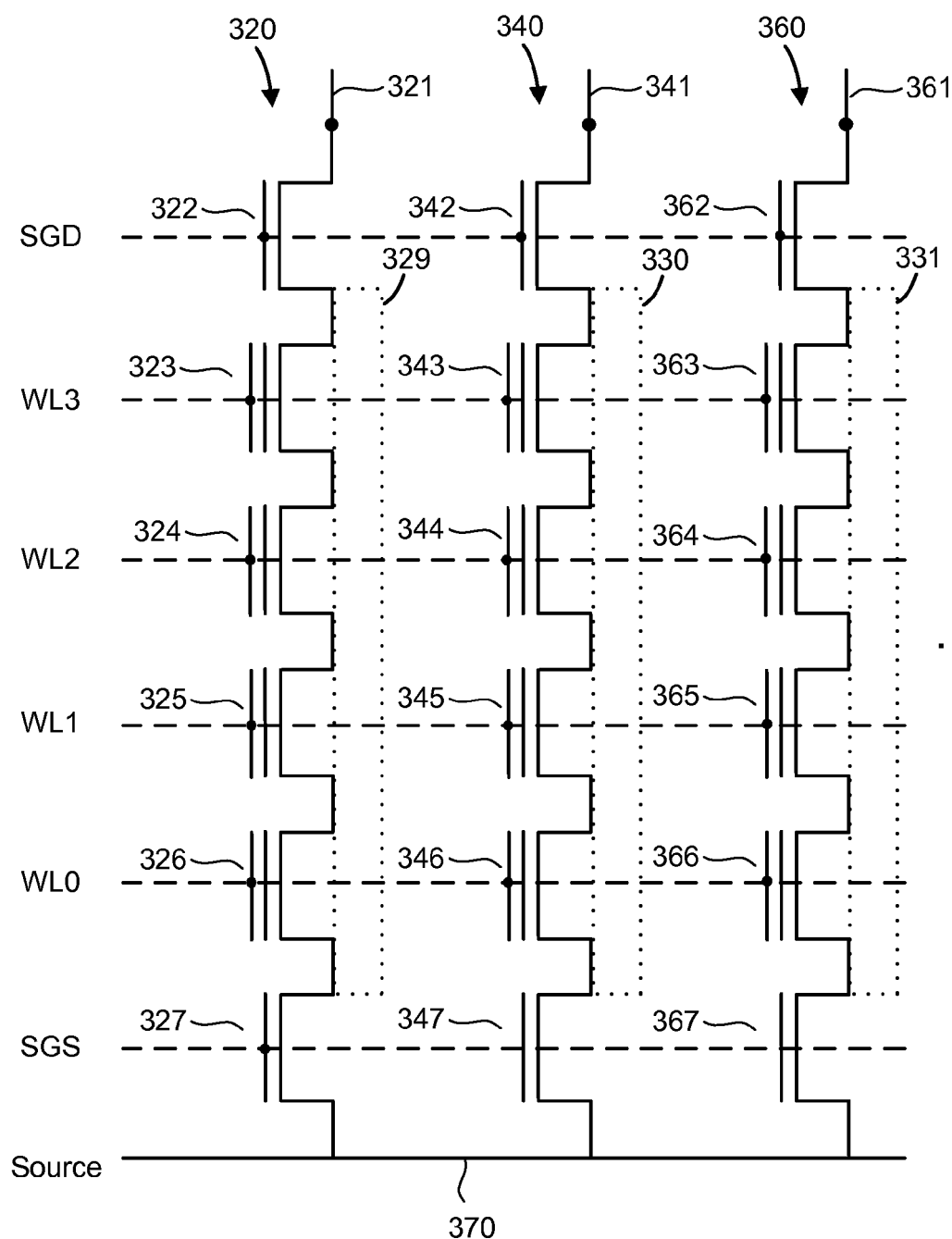
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Example channel regions 329, 330 and 331 which are associated with the NAND strings 320, 340 and 360, respectively, may be created in the substrate. Note that the storage elements and channel regions are depicted as if they were rotated 90 degrees from their actual position.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the portions of the word lines.

When programming a flash storage element, a program pulse is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
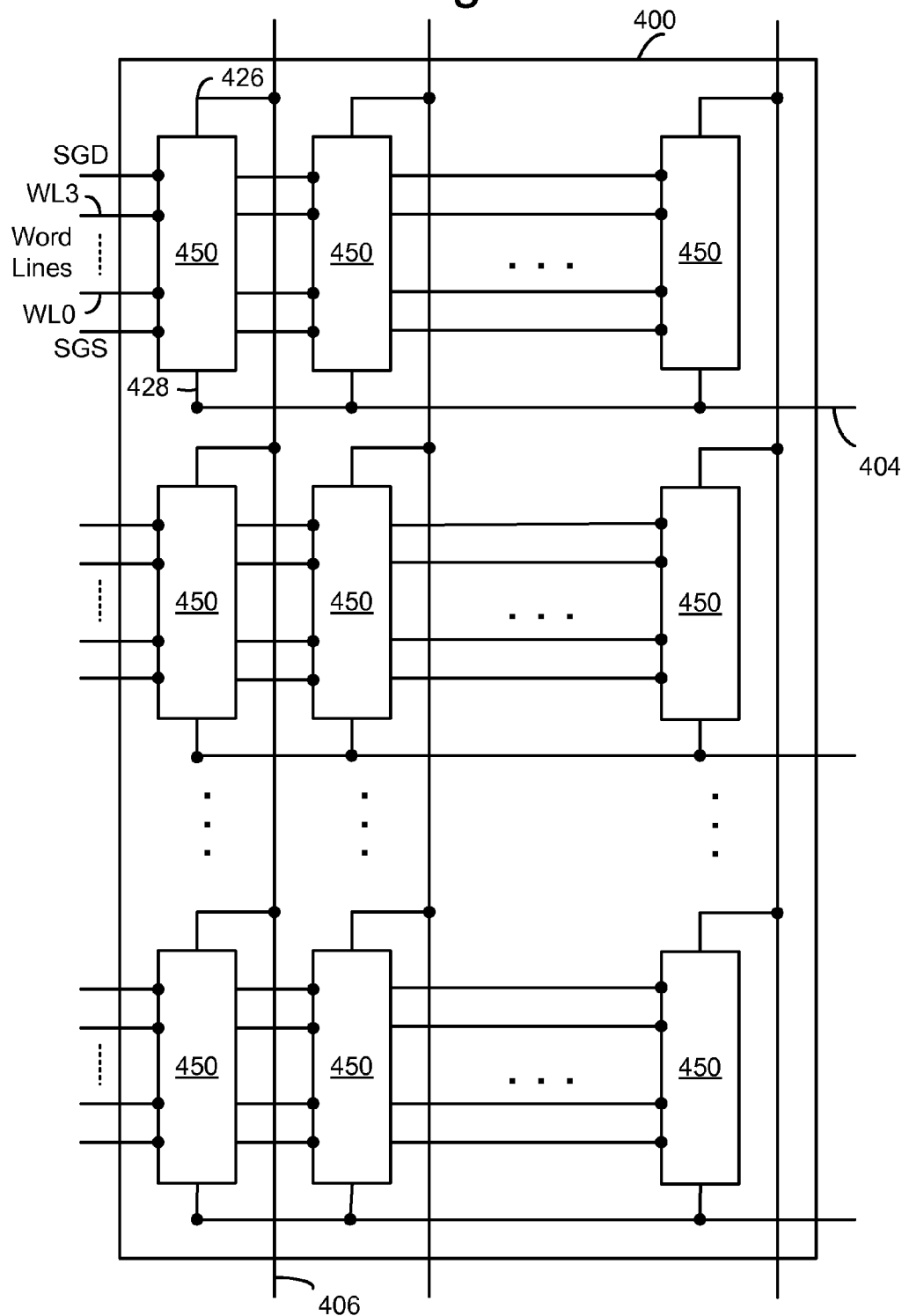
FIG. 4 is a block diagram of an array of NAND flash storage elements.

FIG. 4 illustrates an example of an array 400 of NAND storage elements, such as those shown in FIGS. 1A and 1B. Along each column, a bit line 406 is coupled to the drain terminal 426 of the drain-side select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Figure 5:
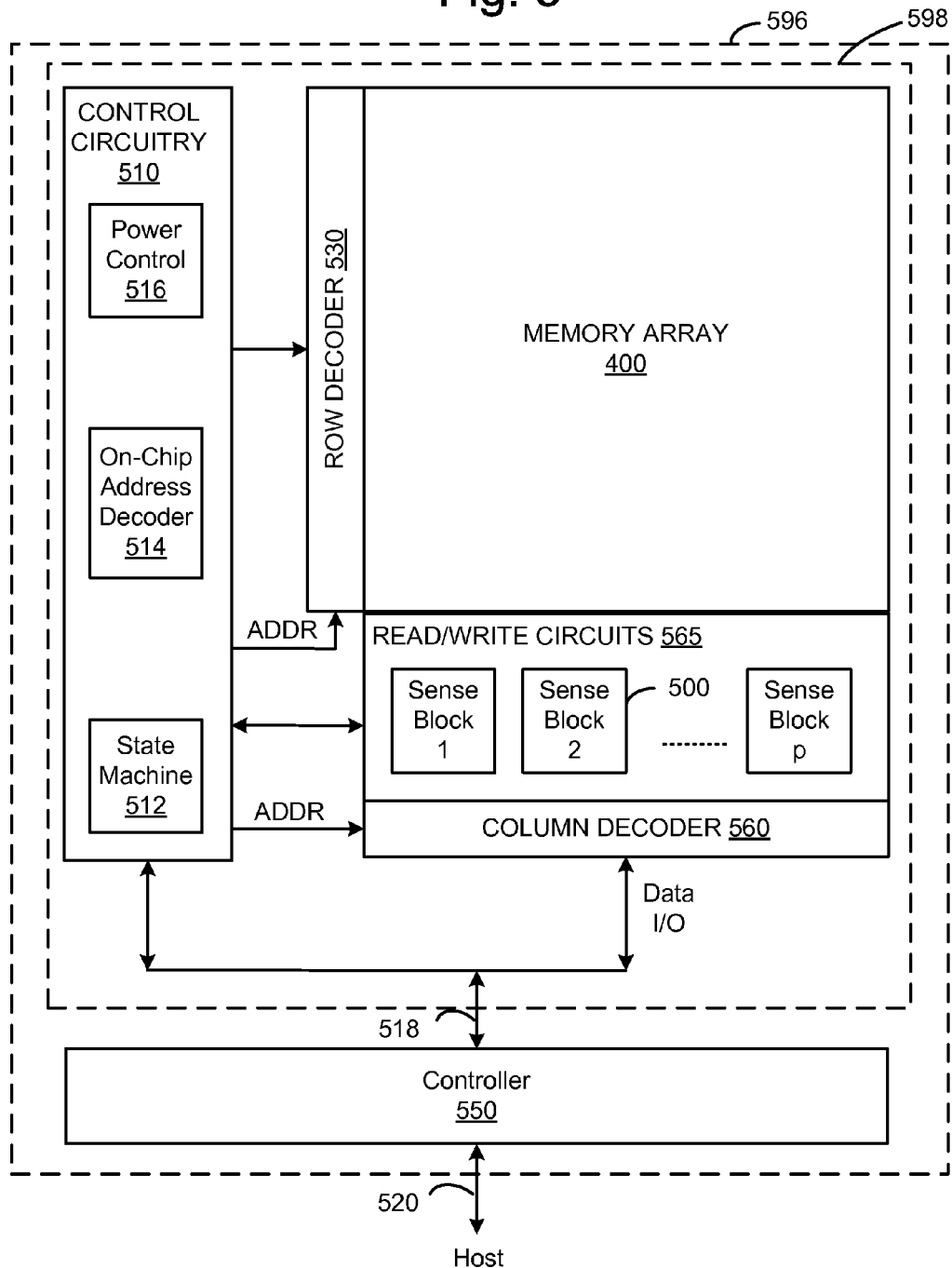
FIG. 5 is a block diagram of a non-volatile memory system using single row/column decoders and read/write circuits.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. See also FIG. 13. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify operations, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
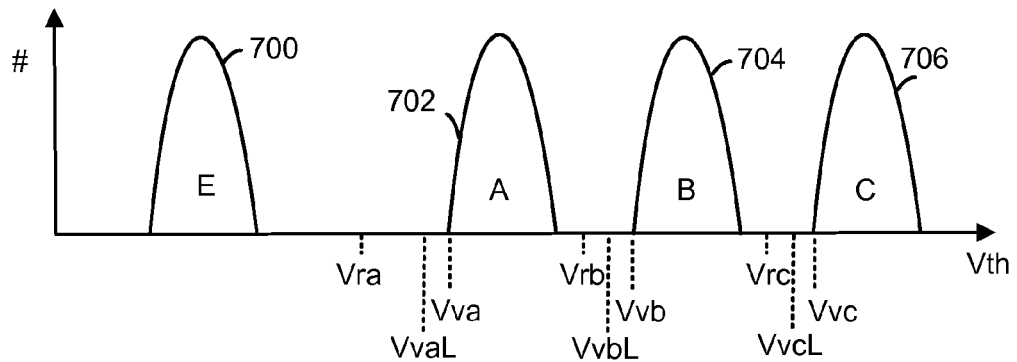
FIG. 7A depicts an example set of threshold voltage distributions.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
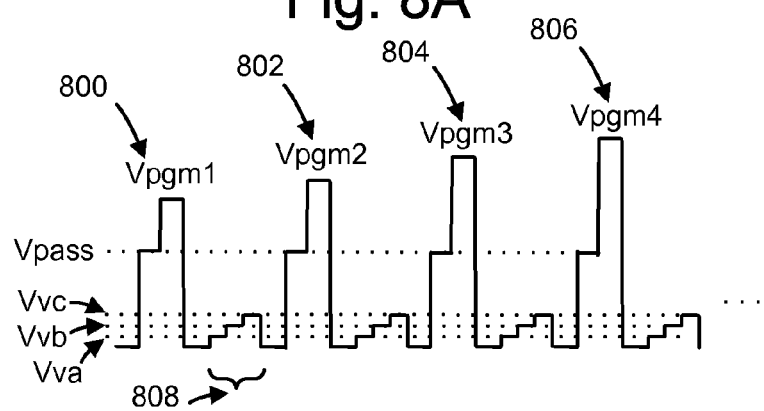
FIG. 8A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8A will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some case, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 2.5 V. This provides greater accuracy by avoiding large step increases in threshold voltage. When the Vth reaches Vva, the storage element is locked out from further programming.

Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write (QPW) or dual verify technique. Note that, in one approach, dual verify levels are not used for the highest state since some overshoot is typically acceptable for that state. Instead, the dual verify levels can be used for the programmed states, above the erased state, and below the highest state.

The slowdown in programming speed mentioned in the previous paragraph is a function of the programming progress of a storage element, e.g., as indicated by its Vth. The slowdown in programming speed can occur independently of a position-based slow down which is also discussed herein. A position-based slow down is imposed on a selected storage element, e.g., a storage element which has not been locked out from programming, based on the position of the storage element in a set of storage elements, such as based on the position along a word line associated with the set of storage elements. This position could be indicated by the storage element being associated with odd- or even-numbered bit lines, for instance.

Figure 7B:
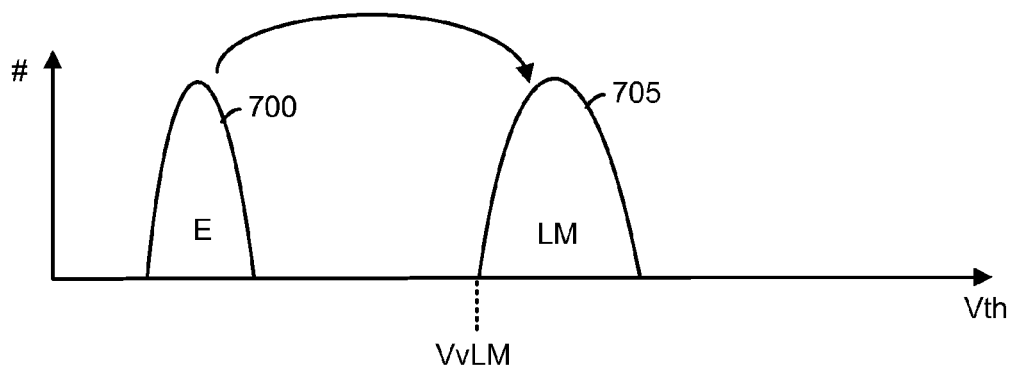
FIG. 7B illustrates a first pass of a two-pass programming technique.

FIG. 7B illustrates a first pass of a two-pass programming technique. In this example, a multi-state storage element that stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 8B:
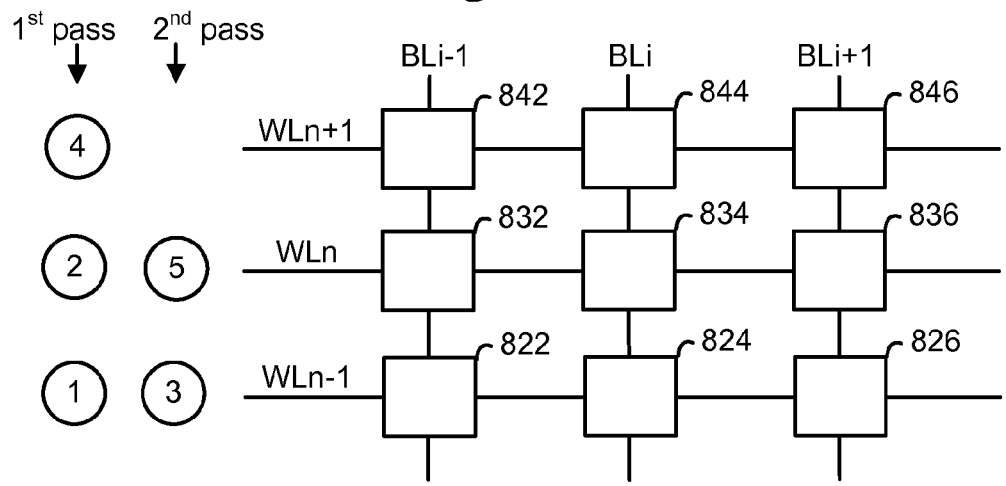
FIG. 8B depicts a multi-pass program operation for a set of storage elements.

In one embodiment, after a storage element is programmed from the E-state to the LM-state, as indicated by step "1" in FIG. 8B, its neighbor storage element on an adjacent word line WLn+1 in the NAND string will then be programmed with respect to its lower page in a respective first programming pass of the adjacent word line, as indicated by step "2" in FIG. 8B.

Figure 7C:
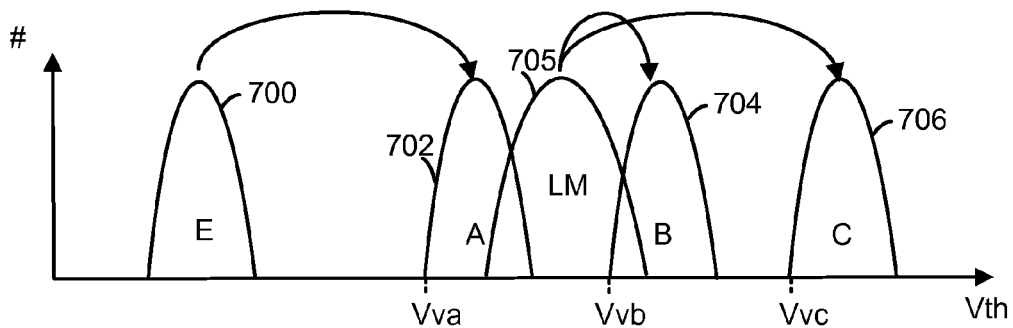
FIG. 7C illustrates a second pass of the two-pass programming technique of FIG. 7B.

FIG. 7C illustrates a second pass of the two-pass programming technique of FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 8B. The second pass of the two-pass programming technique for WLn+1 is indicated by step "5" in FIG. 8B.

Figure 7D:
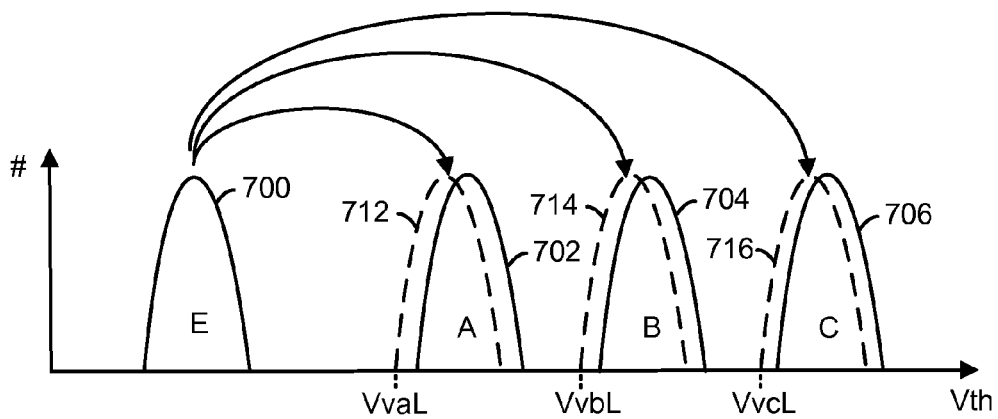
FIG. 7D illustrates a first pass of another two-pass programming technique.

FIG. 7D illustrates a first pass of another two-pass programming technique. In this example, referred to as foggy-fine programming, the A-state, B-state and C-state storage elements are programmed from the E-state to distributions 712, 714 and 716, respectively, using lower verify levels VvaL, VvbL and VvcL, respectively. This is the foggy programming pass. A relatively large program pulse step size may be used, for instance, to quickly program the storage elements to the respective lower verify levels.

Figure 7E:
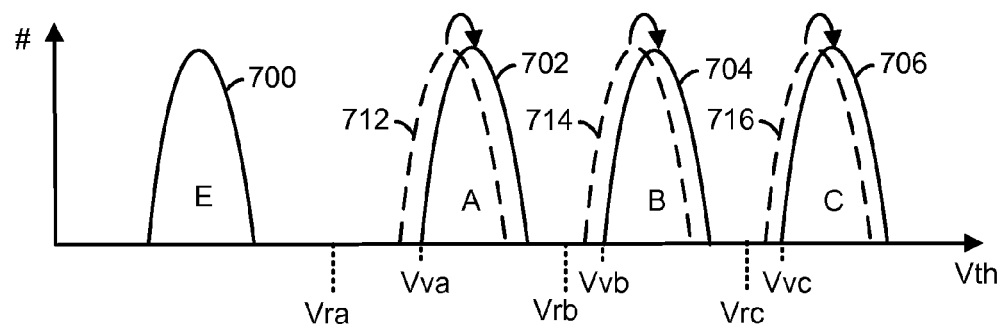
FIG. 7E illustrates a second pass of the two-pass programming technique of FIG. 7D.

FIG. 7E illustrates a second pass of the two-pass programming technique of FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program pulse step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 8A depicts a series of program and verify pulses which are applied to a selected word line during a programming operation. A programming operation may include multiple program-verify iterations, where each iteration applies a program pulse followed by one or more verify voltages, to a selected word line. In one possible approach, the program pulses are stepped up in successive iterations. Moreover, each program pulse may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, a Vpgm3 and Vpgm4, respectively, and so forth. One or more verify voltages, such as example verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program-verify iterations may use verify pulses for the A-state, followed by program-verify iterations which use verify pulses for the A- and B-states, followed by program-verify iterations which use verify pulses for the B- and C-states, for instance.

FIG. 8B depicts a multi-pass program operation for a set of storage elements. The components depicted may be a subset of a much larger set of storage elements, word lines and bit lines. In one possible program operation, storage elements on WLn−1, e.g., storage elements 822, 824 and 826, are programmed in a first programming pass. This step is represented by the circled "1." Next ("2"), storage elements on WLn, e.g., storage elements 832, 834 and 836, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1, e.g., storage elements 842, 844 and 846, are programmed in a first programming pass. Next ("5"), the storage elements on WLn are programmed in a second programming pass to their respective target states.

The main reason to program the storage elements in such a back-and-forth word line order is to minimize the Vth shift on neighboring WL storage elements, after the selected WL storage elements have been programmed to its final pass. A higher Vth shift on neighboring storage elements results in higher interference effects on the selected WL storage elements, which widen their Vth distributions. Thus, reducing the Vth shift on neighboring WL storage elements reduces the interference effects seen by selected storage elements and hence minimizes the Vth distribution widening seen by them.

Figure 9:
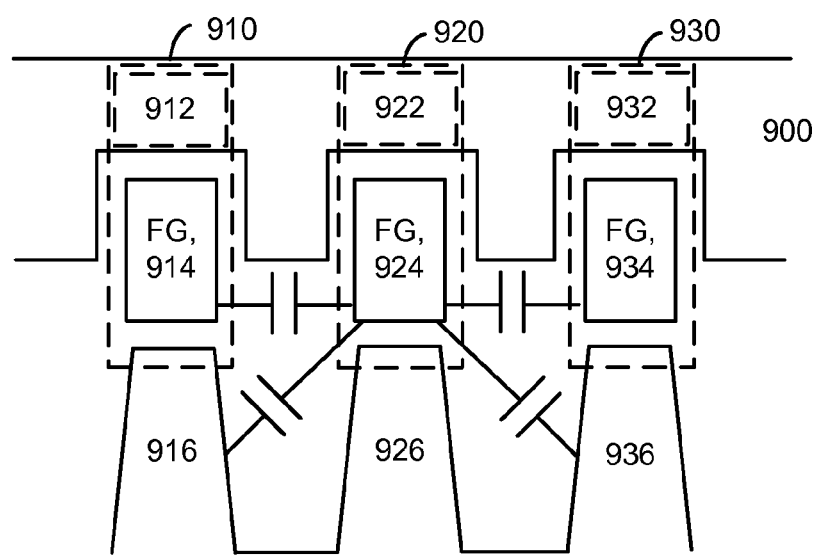
FIG. 9 depicts a cross-sectional view of NAND strings showing channel-to-floating gate coupling and floating gate-to-floating gate coupling.

FIG. 9 depicts a cross-sectional view of NAND strings showing channel-to-floating gate coupling and floating gate-to-floating gate coupling. A bit line or NAND string direction goes into the page, and a word line direction goes from left to right. A word line 900 extends across multiple NAND strings. A first NAND string includes a channel region 916. A storage element 910 in the first NAND string includes a control gate 912, which is a portion of the word line 900, and a floating gate 914. A second NAND string includes a channel region 926. A storage element 920 in the second NAND string includes a control gate 922, which is a portion of the word line 900, and a floating gate 924. A third NAND string includes a channel region 936. A storage element 930 in the third NAND string includes a control gate 932, which is a portion of the word line 900, and a floating gate 934.

As memory devices are scaled down, storage element-to-storage element interferences play an increasingly important role. One of these interferences is channel-to-floating gate coupling during programming. In all-bit line programming, consider a selected storage element 920 of a selected word line which undergoes programming. When a storage element (e.g., 910 or 930) of a neighbor bit line, on the same word line 900, reaches its target data state, it is locked out or inhibited from further programming. In the program portion of the next program-verify iteration, a substrate channel region (e.g., 916 or 936) of the locked out storage element is boosted to prevent the floating gate (e.g., 914 or 934) of the storage element from being programmed further when a program pulse is applied to the selected word line. The boosted potential in the channel couples up to the floating gate 924 of the selected storage element 920, leading to an increase in the effective program pulse voltage (Vpgm) which is seen by the selected storage element when a program pulse is applied. This results in a larger jump in the Vth of the selected storage element than is desired. The Vth distributions of the storage elements can therefore be widened undesirably. In addition to this channel-to-floating gate coupling, floating gate-to-floating gate also further increase the effective Vpgm which is seen by a selected storage element. This is represented by coupling from floating gates 914 and/or 934 to floating gate 924.

Moreover, in a more severe case, if both of the adjacent neighbor storage elements of a selected storage element lock out together, then during the program portion of the next program-verify iteration their channels will both be inhibited. The neighbor channels (e.g., 916 and 936) will be boosted to Vchannel, so that their floating gates (e.g., 914 and 934) are also boosted to a higher potential. Whenever a channel is boosted, a part of Vchannel gets coupled to the floating gate and hence raises the floating gate potential. For example, about 15% of Vchannel in the neighbor channels 916 and 936 may be coupled to the floating gates 914 and 934, respectively. Both Vchannel and the neighbor floating gate potential couple up to the floating gate 924 of the selected storage element and increase the effective Vpgm. The total amount of coupled voltage depends on Vchannel, coupling from the channel (916 and/or 936) to the floating gate (914 and/or 934), and coupling from the floating gates 914 and/or 934 to the floating gate 924. With scaling, these couplings become greater, resulting in an increase of the magnitude of the capacitive coupling effect described above. If the victim storage element which experiences the coupling reaches the lockout condition on the program-verify iteration in which the coupling is a maximum, the Vth of the victim storage element takes a larger jump and ends up near the upper end of Vth distribution of the set of storage elements being programmed. Similarly, if a number of such victim storage elements reach a lockout condition on a program-verify iteration in which the coupling is a maximum, the Vth of the set of storage elements being programmed is widened. The net impact of this coupling effect is at its highest when the neighboring storage elements lock out at a program-verify iteration that is just before the program-verify iteration at which the selected storage element locks out. Thus, a key in reducing this effect is to reduce the chances of neighboring storage elements locking out at a similar program-verify iteration count.

One approach for reducing coupling includes programming even and odd numbered bit lines separately (odd-even programming) so that for each storage element, the neighbor storage element or a neighbor bit line is always in an inhibit state. While this technique is effective, it has a significant performance penalty since programming time is increased.

Another approach is to float the bit lines and channels for the still-programming storage elements. In case a neighbor storage element locks out, the floated bit line and channel couples up to a higher value that slows down programming of the storage element and hence self-compensates for the coupling. However, this approach has reduced effectiveness due to parasitic couplings to the floating bit line.

In the regular programming method, all programming bit lines are grounded with Vbl=0 V (assuming QPW mode is not used). Thus, the storage elements of both even and odd bit lines program at the same speed and hence the probability of storage elements locking out at any given pulse is the same on the even- and odd-numbered BLs. Thus, the probability of storage elements associated with even- and odd-numbered BLs locking out on similar program pulse number (#) (this probability is product of the two probabilities) is relatively high. Thus, the chances of being impacted by coupling are also relatively high. In a proposed approach, the impact of capacitive coupling is estimated by the probability of storage elements locking out at program pulses which are close to one another, e.g., where storage elements associated with odd-numbered bit lines lock out at a program pulse #N and storage elements associated with even-numbered bit lines lock out at a program pulse #N+1, or vice-versa. In other words, the impact of coupling is a function of the product of the probability of storage elements associated with even-numbered bit lines locking out at program pulse #N and the probability of storage elements associated with odd-numbered bit lines locking out at program pulse #N+1, or vice-versa.

To benefit from this observation, we can reduce the probability of storage elements associated with even- and odd-numbered bit lines locking out at similar program pulses by using a bit line bias on alternate bit lines to slow down the programming of the associated storage elements relative to the storage elements associated with the remainder of the bit lines. For example, alternate bit lines (e.g., all even or all odd bit lines) can be biased to a certain voltage (Vbl-slow), at a slow down level, to slow down the programming of the associated storage elements and hence create a difference between programming speeds of the associated storage elements of the even- and odd-numbered bit lines. This will reduce the chances of the associated storage elements of the even- and odd-numbered bit lines locking out at similar program pulse # and hence reduce the chances of being impacted by coupling.

Thus, a programming speed can be reduced for some of the storage elements but not for others, based on the positions of the storage elements. For example, programming speed can be reduced for storage elements associated with odd-numbered bit lines, but not for storage elements associated with even-numbered bit lines. Or, programming speed can be reduced for storage elements associated with even-numbered bit lines, but not for storage elements associated with odd-numbered bit lines. In other words, different programming speeds can be provided for first and second adjacent storage elements. Optionally, instead of slowing down every alternate storage element along a word line, in a pattern: slow, normal, slow normal, . . . other slow down patterns may be used, such as: slow, normal, normal, slow, normal, normal, . . . , or slow, slow, normal, slow, slow, normal, . . . . These alternatives may not be optimal but may still be effective.

Generally, we can determine whether to subject a storage element of a set of storage elements which is not locked out from programming to a slow down measure based on a position of the storage element along a word line. The storage element can be subjected to the slow down measure when the position of the storage element is in a first set of positions along the word line, such as a set of positions associated with odd-numbered bit lines, where the first set of positions includes every other position along the word line. Further, the storage element is not subjected to the slow down measure when the position of the storage element is in a second set of positions along the word line, such as a set of positions associated with even-numbered bit lines, where the positions of the first set of positions are interleaved with the positions of the second set of positions. Programming speed can be reduced by raising bit line voltages, for instance, to a level which allows programming to occur but at a reduced rate. This level is below a full inhibit or lockout level. This approach reduces coupling experienced by the selected storage elements and can lead to tighter Vth distributions, resulting in better endurance and/or better performance.

Note that when we refer to programming being slow or program speed being reduced for any storage element, then it refers to programming of that storage element lagging behind those of other storage elements, while the rate at which programming happens is still the same. For example, if a storage element's programming is slowed down by 1 V, this means the program pulse voltage (Vpgm) needed to program that storage element to a certain Vth will be 1 V higher than other similar storage elements. However, the speed at which Vth increases at a program pulse for any storage element is still the same and is determined by the Vpgm step size. On the other hand, factors such as manufacturing variations in storage elements can cause storage elements to program at different speeds.

Figure 10:
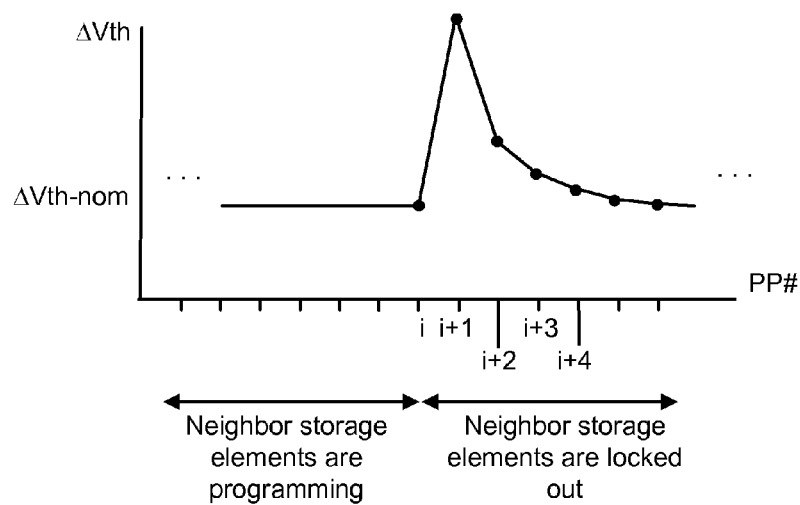
FIG. 10 depicts a capacitive coupling effect which occurs for a victim storage element when neighboring storage elements reach a lockout condition.

FIG. 10 depicts a capacitive coupling effect which occurs for a victim storage element when neighboring storage elements reach a lockout condition. The x-axis depicts a program pulse number (PP#), or program loop number, which is a number of program-verify iterations in a programming operation. The programming operation can represent, e.g., a one-pass programming technique, or a single pass of a multi-pass programming technique. A programming pass begins with a first program loop and continues until all or most storage elements have completed programming, or until a maximum allowed number of program loops have been completed.

The y-axis depicts a change in the threshold voltage (Vth) of a storage element which continues to undergo programming and does not reach the lockout condition in the time period depicted. A fixed Vpgm step size is assumed but is not required. Typically, when each program pulse is applied, the Vth of a storage element will increase at a nominal level, $\Delta$Vth-nom, which is almost equal to the Vpgm step size. At each program pulse, the Vpgm seen by the storage element steps up by the amount equal to the Vpgm step size, which results in electrons being injected into the floating gate of the storage element leading to an increase in its Vth by $\Delta$Vth-nom that is almost equal to the Vpgm step size. In such a case, the storage element is considered to be under steady state programming. This nominal increase in $\Delta$Vth occurs in a time period up to the ith program loop during which, one or both neighbor storage elements are assumed to be still programming and have not reached the lockout condition. In the time period after the ith program loop, the one or both neighbor storage elements are assumed to have reached the lockout condition.

Thus, at the ith program loop, the one or both neighbor storage elements reach the lockout condition, e.g., they are verified to have reached a target Vth level which is associated with a data state. On the i+1th program pulse, the channels of the inhibited neighbor storage element(s) is (are) fully boosted to a Vboost level, which also raises the voltage of floating gates belonging to the inhibited storage elements. As described earlier, the coupling from the boosted channel and floating gate of the neighboring storage element raises the effective Vpgm seen by the selected storage element. Thus, the change in Vpgm seen by the storage element from the ith to i+1th program pulse is larger than the Vpgm step size. This results in a ΔVth that is substantially larger than ΔVth-nom. The sudden large ΔVth disturbs the selected storage element from its original steady state programming. On subsequent program pulses, the channels of inhibited storage elements are again boosted to the same boost levels and hence result in the same amount of coupling to the floating gate of selected storage element. Thus, the change in Vpgm seen by the storage element returns to the same level as the Vpgm step size. Even though the change in Vpgm returns back to the Vpgm step size immediately on i+2th program pulse, the storage element ΔVth still remains higher than ΔVth-nom since it takes few pulses for the storage element to return back to a steady state programming. With subsequent program pulses, the selected storage element approaches a new steady state where ΔVth at each program pulse returns to ΔVth-nom. ΔVth gradually reduces until it settles back to ΔVth-nom.

Note that in a given program loop, different storage elements can be verified to reach target verify levels of different target data states, in a multi-level device such as one having four or more data states. For example, assume there is an erased state E and programmed states A, B and C. Typically, the A-state storage elements will reach the lockout condition first, then the B-state storage elements will reach the lockout condition, and finally the C-state storage elements will reach the lockout condition. The E-state storage elements remain locked out right from the first program-verify iteration and hence are not programmed during the programming pass. Due to manufacturing variations, it is possible, e.g., for a faster C-state storage element to lockout at the same time as a slower B-state storage element. The techniques for reducing coupling provided herein are effective in these different scenarios.

In this example, a full level of channel boosting is used for the channels regions which are associated with the one or both neighbor storage elements, starting at the i+1th program loop, so that a substantial amount of capacitive coupling is realized. In practice, the coupling effect will be less if the two neighboring storage elements reach the lockout condition at different program loops, than if they reach the lockout condition at the same program loop. The curve of FIG. 10 is meant to represent a typical scenario.

From a point of view of the Vth distribution, the most critical factor is the ΔVth jump the storage elements take just before going beyond its target verify-level and getting locked out. The larger the ΔVth jump on that pulse, the greater the resulting Vth distribution widening. Here, the maximum Vth distribution widening will occur if the selected storage element receives a large ΔVth at i+1th program pulse and goes beyond its target verify-level. Such storage elements have a higher likelihood of ending up in the extreme upper-edge of the Vth distribution and thus lead to a wider Vth distribution. By using different programming speeds for adjacent storage elements to reduce the probability of the scenario of FIG. 10 occurring, the widening of Vth distributions can be reduced.

Figure 11:
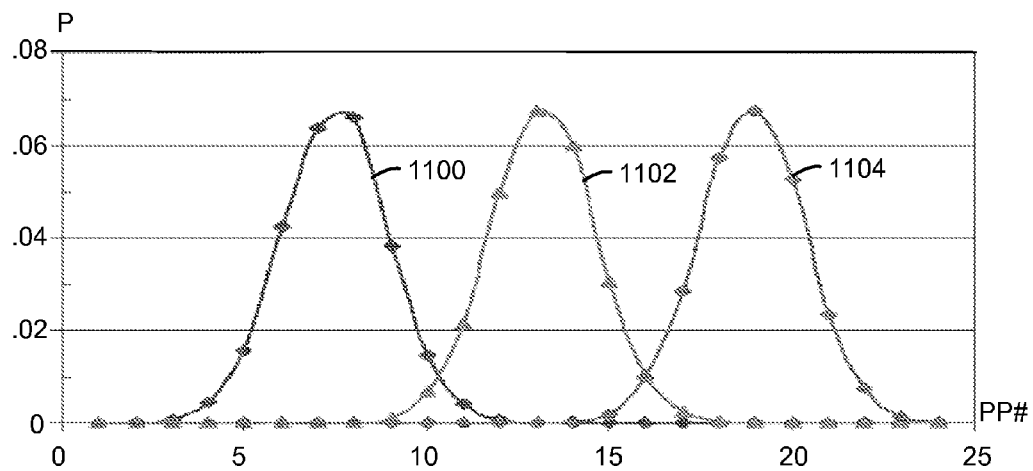
FIG. 11 depicts a probability of a storage element reaching lockout versus program pulse number, for each of A-, B and C-data states.

FIG. 11 depicts a probability (P) of a storage element reaching lockout versus program pulse number (PP#), for each of A-, B and C-data states (curves 1100, 1102, 1104, respectively). The graph represents all storage elements in a set of storage elements which are being programmed in a programming operation, such as a set of storage elements associated with a selected word line. The curves represent storage elements associated with even- and odd-numbered bit lines. By showing the probability for the different target data states separately, it can be seen that, for each state, the peaks in probability are separated by a few program pulses, such as about 5 or 6 program pulses. Probability is measured on a scale of 0 to 1, with 1 representing a 100% probability.

Figure 12A:
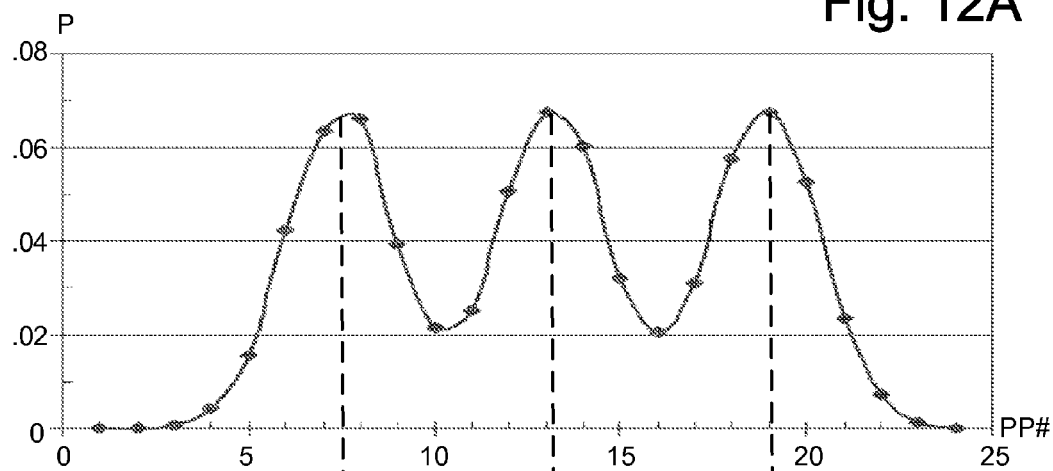
FIG. 12A depicts a probability of a storage element reaching lockout versus program pulse number, based on a sum of the probabilities of the A-, B and C-data states of FIG. 11, for storage elements associated with even-numbered bit lines, with no position-based slow down measure applied.

FIG. 12A depicts a probability of a storage element reaching lockout versus program pulse number, based on a sum of the probabilities of the A-, B and C-data states of FIG. 11, for storage elements associated with even-numbered bit lines, with no position-based slow down measure applied. The curve is obtained by summing the curves of FIG. 11. When a nominal programming speed is used for all storage elements, both even and odd bit lines program together at the same speed. Thus, the probability of storage elements locking out on even and odd bit lines will be the same. We can identify the probability of a storage element locking out at pulse #N as p(N), the function represented in graph, with N as program pulse #. N is a positive integer number (one or higher).

If we assume that above-described coupling effect mainly occurs to a victim storage element on the immediate next program pulse (an Nth program pulse) after a program pulse (an N−1th program pulse) in which the adjacent neighbor storage elements reach lockout, we can estimate the probability (Pcoupling(N)) of any storage element being impacted by coupling on program pulse #N as follows (where Pcoupling_Even (N) is the probability of a storage element of an even-numbered bit line being impacted by coupling at pulse #N, Pcoupling_Odd (N) is the probability of a storage element of an odd-numbered bit line being impacted by coupling at pulse #N, p(N)_Even or p(N−1)_Even is the probability of a storage element of an even-numbered bit line reaching lockout at program pulse #N or #N−1, respectively, and p(N)_Odd or p(N−1)_Odd is the probability of a storage element of an odd-numbered bit line reaching lockout at program pulse #N or #N−1, respectively):

$$P\text{coupling}(N) \sim P\text{coupling\_Even}(N) + P\text{coupling\_Odd}(N)$$

Since, $$P\text{coupling\_Even}(N) = p(N)\_\text{Even} * p(N-1)\_\text{Odd} \text{ and}$$

$$P\text{coupling\_Odd}(N) = p(N)\_\text{Odd} * p(N-1)\_\text{Even}, \text{ we have}$$

$$P\text{coupling}(N) \sim p(N)\_\text{Even} * p(N-1)\_\text{Odd} + p(N)\_\text{Odd} * p(N-1)\_\text{Even}.$$

Note that in a nominal programming method, the storage elements of the even and odd bit lines program at the same speed, which means p(N)_Even=p(N)_Odd=p(N). Thus, Pcoupling(N)~p(N)*p(N−1)+p(N)*p(N−1)=2p(N)*p(N−1), as plotted in FIG. 12C.

Figure 12B:
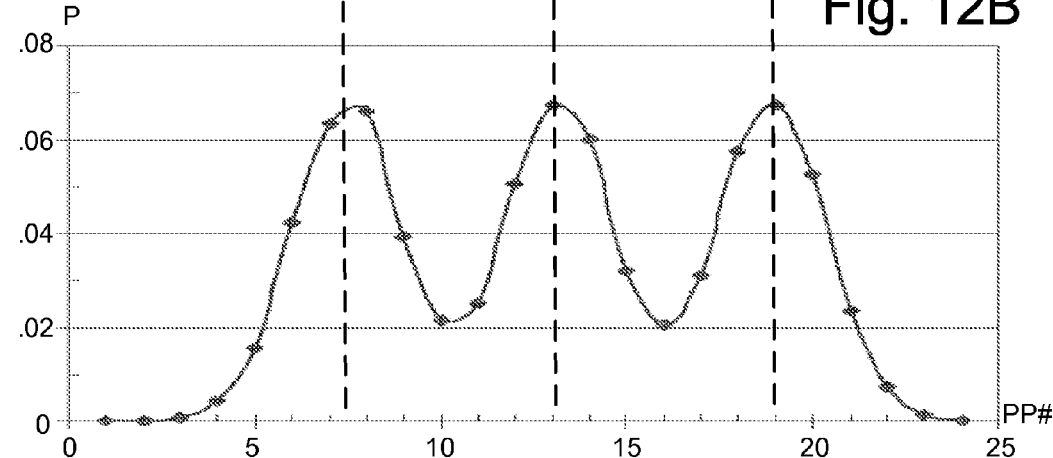
FIG. 12B depicts a probability of a storage element reaching lockout versus program pulse number, based on a sum of the probabilities of the A-, B and C-data states of FIG. 11, for storage elements associated with odd-numbered bit lines, with no position-based slow down measure applied, showing a same result as FIG. 12A.

FIG. 12B depicts a probability of a storage element reaching lockout versus program pulse number, based on a sum of the probabilities of the A-, B and C-data states of FIG. 11, for storage elements associated with odd-numbered bit lines, with no position-based slow down measure applied, showing a same result as FIG. 12A. The vertical dashed lines indicate how the probability peak is aligned for each target data state.

Figure 12C:
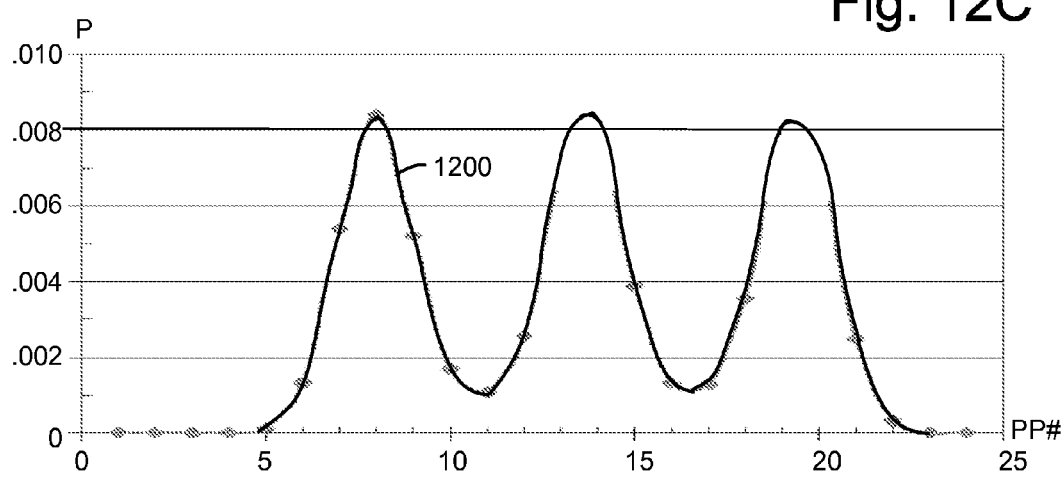
FIG. 12C depicts a probability of a storage element being affected by a maximum capacitive coupling effect versus program pulse number, with no position-based slow down measure applied.

FIG. 12C depicts a probability of a storage element being affected by a maximum capacitive coupling effect versus program pulse number, with no position-based slow down measure applied.

The value of Pcoupling(N)~p(N)*p(N−1)+p(N)*p(N−1)= 2p(N)*p(N−1), discussed above, is graphed. This is the probability of a storage element being impact by coupling on any program pulse #N, in the nominal programming technique (where even and odd bit lines program at the same speed). The probability curve 1200 has a peak for each of the target data states. The peaks correspond to a program pulse # at which most of the A-, B- or C-state storage elements reach lockout. In this example, most of the A-state storage elements reach lockout at PP#=8, most of the B-state storage elements reach lockout at PP#=14 and most of the C-state storage elements reach lockout at PP#=19. A similar curve could be provided when additional target data states are used.

Figure 13A:
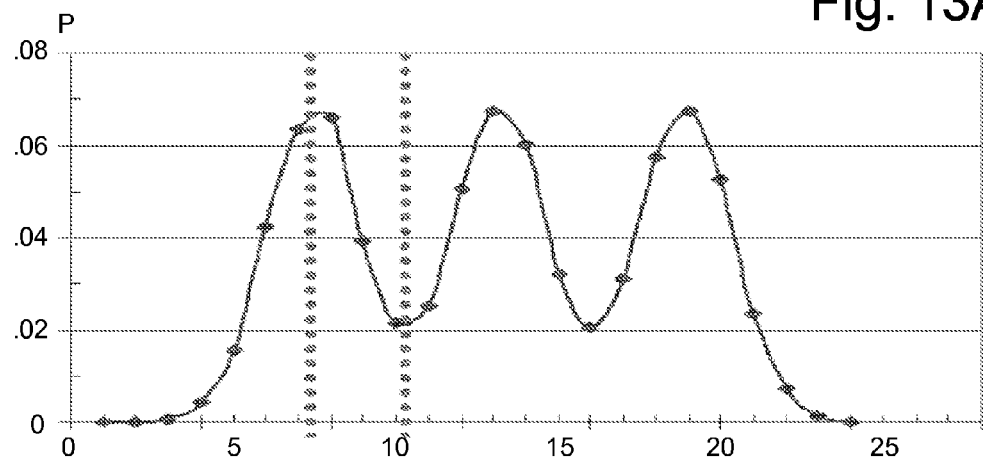
FIG. 13A repeats the curve of FIG. 12A, identifying a peak and a trough for the A-state, for comparison with FIG. 13B.
Figure 13B:
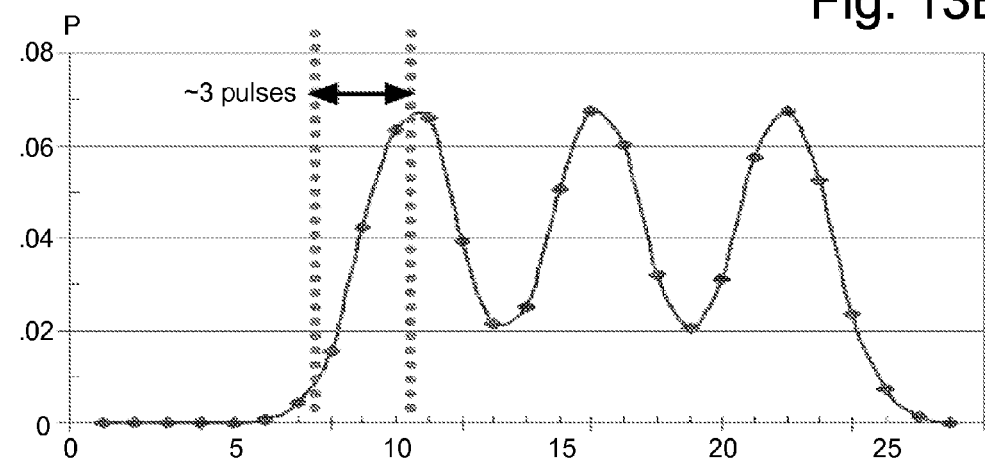
FIG. 13B represents a probability of a storage element reaching lockout versus program pulse number for storage elements associated with odd-numbered bit lines, with a slow down measure applied, so that the curve of FIG. 13A is shifted three program pulses to the right.

FIG. 13A repeats the curve of FIG. 12A, identifying a peak and a trough for the A-state, for comparison with FIG. 13B. In this example, the peak is at about PP#=7 and the trough, between the A- and B-states, is about PP#=10, as depicted by vertical dotted lines.

FIG. 13B represents a probability of a storage element reaching lockout versus program pulse number for storage elements associated with odd-numbered bit lines, with a slow down measure applied, so that the curve of FIG. 13A is shifted three program pulses to the right. In this programming technique, storage elements associated with odd bit lines are slowed down by about three program pulses by using a bit line bias on all odd bit lines of Vbl-slow (~0.75V). This is a position-based slow down measure because it is applied based on the position of the storage element along a word line, e.g., a position of being associated with an odd- or even-numbered bit line.

If we slow down the storage elements associated with odd-numbered bit lines by about three program pulses, we will need about three extra program pulses to program all the storage elements, which could lead to a longer programming time and hence a lower programming performance. Also, the extra program pulses would result in the final Vpgm being higher, which can make program disturb worse. Some methods to reduce or avoid this penalty are discussed later.

For example, if the program pulse step size is 0.35 V, the slow down in programming speed by three program pulses is equivalent to the lockout condition being reached at a final Vpgm which is about 3*0.35V=1.05V higher than in the nominal programming technique.

Figure 13C:
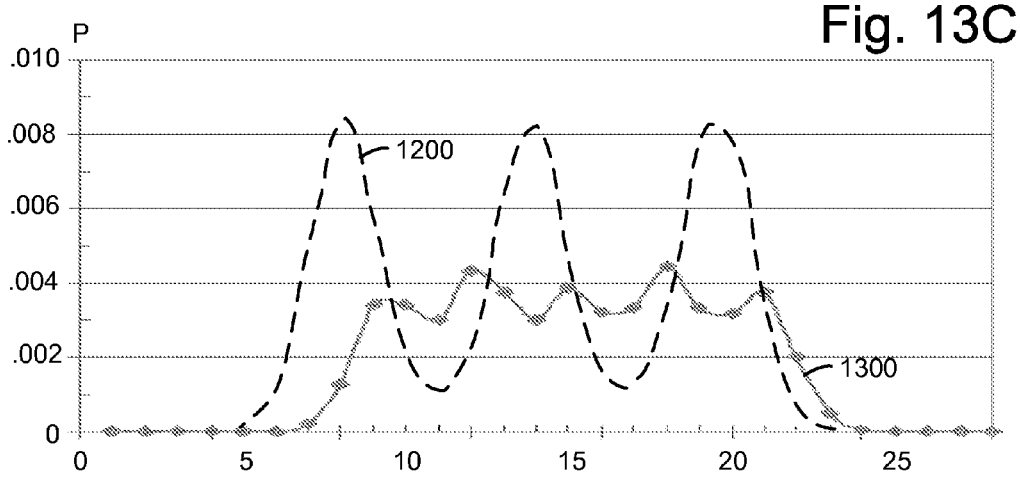
FIG. 13C depicts a probability of a storage element being affected by a maximum capacitive coupling effect versus program pulse number, with a position-based slow down measure applied, with a comparison to the curve of FIG. 12C.

FIG. 13C depicts a probability of a storage element being affected by a maximum capacitive coupling effect versus program pulse number, with a position-based slow down measure applied, with a comparison to the curve of FIG. 12C. The value of Pcoupling(N)~p(N)*p(N−1)+p(N)*p(N−1)=2p(N)*p(N−1), discussed above, is graphed. By comparing curve 1300 to curve 1200, it can be seen that the probability of being impacted by coupling is more uniformly distributed across the different program pulse numbers. Also, the peak value of Pcoupling (curve 1300) is about one-half (0.004 vs. 0.008) of what it was in the nominal programming technique (curve 1200). As a result, a smaller Vth widening can be achieved for programmed distributions. Optimal results can be achieved by aligning the peaks in the probability distribution of the storage elements associated with the odd-numbered bit lines with the troughs of the probability distribution of the storage elements associated with the even-numbered bit lines, or vice-versa.

For example, assume there are three programmed states (e.g., the A-, B- and C-states) separated by ~2 V in verify levels. That is, Vvc−Vvb=Vvb−Vva=2 V (see FIG. 7A). As we slow down the programming of the storage elements of the odd-numbered bit lines, we reduce the probability of storage elements associated with even- and odd-numbered bit lines locking out at similar program pulses and hence reduce coupling. In particular, when the programming speed difference is ~1 V (about half of the verify level difference between states), a lowest probability of storage element locking out at similar pulses is achieved. But, if we slow down the programming of the storage elements associated with odd-numbered bit lines further, then we would again start to see a higher probability of storage elements associated with even- and odd-numbered bit lines locking out at similar program pulses. For example, if the programming of the odd-numbered bit lines is slowed down by ~2 V, then at a program pulse in which B-state storage elements reach lockout on even-numbered bit lines, the A-state storage elements will reach lockout on the odd-numbered bit lines. Thus, the probability of coupling for those storage elements will be similar to what it was in the nominal case, where a position-based slow down measure is not applied. Thus, there is an optimum value for Vbl-slow which will be a function of the state-to-state separation (e.g., the difference in verify levels) for a given memory device. This Vbl-slow bias can be configured by one or more ROM fuse parameters which can be optimized on the memory device to obtain the maximum benefit of this programming technique.

Figure 14:
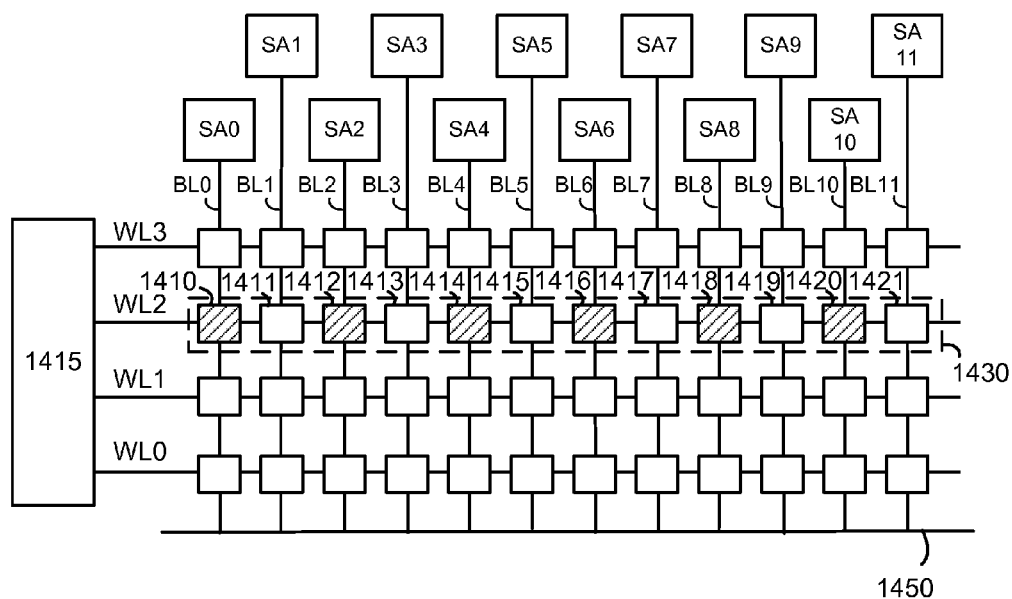
FIG. 14 depicts a set of storage elements which includes storage elements associated with even-numbered bit lines and storage elements associated with odd-numbered bit lines, in an all bit line programming configuration.

FIG. 14 depicts a set of storage elements which includes storage elements associated with even-numbered bit lines and storage elements associated with odd-numbered bit lines, in an all bit line programming configuration.

An all bit line configuration generally involves concurrently storing data of a page in adjacent storage elements. A page is the smallest unit of data which is written as a unit by a host device. A block of storage elements can include a number of rows of storage elements which are arranged along associated word lines, such as word lines WL0, WL1, WL2 and WL3. A word line voltage source 1415 provides voltages to the word lines during programming and read operations. Typically, one word line is a selected word line which includes one or more storage elements that have been selected for programming or reading. The storage elements are associated with bit lines which are labeled BL0 through BL11, in this example. The storage elements may be arranged in NAND strings, where each NAND string is associated with a respective bit line. Further, a sense amp is associated with each bit line for sensing whether a selected storage element is conductive. A controller within the memory device accesses the sense amp to determine whether a selected storage element is conductive and stores corresponding data in a buffer (data latch) which indicates the state of a storage element. The sense amps are shown as SA0-SA11. A common source line 1450 is also provided.

Consider WL2 as a selected word line. A number of storage elements are arranged along the word line. A set 1430 of storage elements could include all, or fewer than all of the storage elements associated with WL2. Further, a first set of positions along the word line can include the positions of the storage elements associated with the even-numbered bit lines, that is, storage elements 1410, 1412, 1414, 1416, 1418 and 1420, which are associated with BL0, BL2, BL4, BL6, BL8 and BL10, respectively. The storage elements in the first set of positions in the set 1430 are identified by a box marked with diagonal lines. Similarly, a second set of positions along the word line can include the positions of the storage elements associated with the odd-numbered bit lines, that is, storage elements 1411, 1413, 1415, 1417, 1419 and 1421, which are associated with BL1, BL3, BL5, BL7, BL9 and BL11, respectively. The positions of the first set of positions are interleaved with the positions of the second set of positions. The storage elements in the second set of positions in the set 1430 are identified by a clear box. Further, any two adjacent storage elements, such as 1415 and 1416, for instance, can be considered adjacent first and second non-volatile storage elements.

Figure 15A:
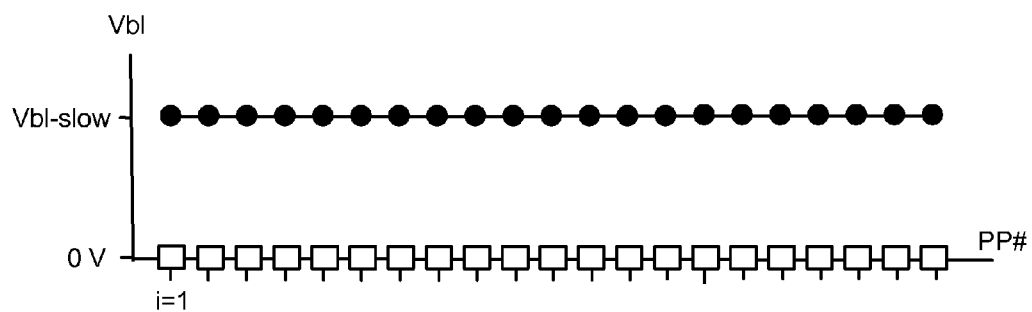
FIG. 15A depicts bit line voltages applied to even-numbered bit lines, for which no position-based slowdown measure is applied, and to odd-numbered bit lines, for which a position-based slowdown measure is applied, where the bit line voltages are independent of program pulse number.

FIG. 15A depicts bit line voltages applied to even-numbered bit lines, for which no position-based slowdown measure is applied, and to odd-numbered bit lines, for which a position-based slowdown measure is applied, where the bit line voltages are independent of program pulse number (PP#). The PP# can be equivalent to a program-verify iteration #. In this and other following figures, the dark circles represent bit lines voltages which are applied to bit lines (e.g., odd-numbered bit lines) associated with storage elements which are to receive a position-based slow down measure, and the open boxes represent bit lines voltages which are applied to bit lines (e.g., even-numbered bit lines) associated with storage elements which are not to receive a position-based slow down measure. As an example, Vbl-slow=0.75 V is applied as a slow down measure for all program pulses. This approach is effective in reducing coupling but results in an increased program time. The PP# can be expressed by an index i, where i is an integer greater than zero.

FIG. 15B depicts bit line voltages applied to even-numbered bit lines, for which no position-based slowdown measure is applied, and to odd-numbered bit lines, for which a position-based slowdown measure is applied, where the position-based slow down measure is removed before a programming operation is completed. This approach is effective in reducing coupling as well as avoiding or minimizing an increase in programming time and use of a higher Vpgm-final.

Thus, we can apply Vbl-slow starting from the initial program pulse (PP=1) and extending through an (n+m)th program pulse, which is before the final program pulse of the programming operation. A range of m+1 program pulses in which Vbl-slow is applied extends from PP=n to PP=n+m. n=1 in one approach. One or more subsequent program-verify iterations start at PP=n+m+1 and extend for k additional program pulses, up until the last program pulse, PP=n+m+k, the slow down measure is not applied. The value k is not necessarily known until the programming operation has completed. The variables n, m and k are integer numbers, greater than zero.

The value of m can be fixed, so that the slow down measure is applied up until a fixed program pulse number is reached. For instance, m can be set by a ROM fuse parameter in the memory device. For subsequent pulses, starting at n+m+1, we can ground all of the bit lines of the selected storage element, that is, the storage elements which have not yet reached the lockout condition. As a result, the benefit of reduced coupling will not be realized from pulse n+m+1 and onwards. However, n+m can be chosen such that only the storage elements having the highest target data state have not yet reached lockout. For example, in a four-level memory device, this can be the C-state storage elements when the A- and B-state storage elements are mostly locked out. Thus, we would only see coupling effects on the C-state storage element, leading to a wider upper tail of the Vth distribution of the C-state. However, this tradeoff is acceptable since there is no loss in the Vth window (the gap between the erase-state upper tail and the C-state or other highest state lower tail). At PP=n+m+1, when we suddenly reduce the voltage from Vbl-slow to 0 V for the storage elements which had been subject to the slow down measure, the effective Vpgm which is seen by these storage element is increased so that there may be a sudden jump in their Vth, causing a wider Vth distributions. To counter this, we can step down Vpgm by an increment for the first program pulse in which the slow down measure is removed, e.g., when PP=n+m+1, as discussed in connection with FIG. 15C1. Or, we can continue to step up Vpgm, but at a smaller positive increment, for the first program pulse in which the slow down measure is removed, e.g., when PP=n+m+1, as discussed in connection with FIG. 15C3. Vpgm can subsequently be stepped up at a larger increment. Or, Vpgm can be fixed for the first program pulse in which the slow down measure is removed, as discussed in connection with FIG. 15C2.

Optionally, the last, (n+m)th, program pulse in which the slow down measure is applied, or the first, (n+m+1)th program pulse in which the slow down measure is removed, can be determined adaptively, based on the progress of the programming operation. Similarly, the first, nth, program pulse in which the slow down measure is applied can be determined adaptively. See FIG. 15F for further details.

FIG. 15C1 depicts a program pulse voltage versus program pulse number for use with the bit line voltages of FIG. 15B, where the program pulse voltage initially steps up at a first rate, then steps down for one program pulse at a second rate when the position-based slow down measure is removed, and then steps up at a third rate, higher than the first rate. The program pulses in the programming operation start at PP=1 with an initial level of Vpgm-init, and step up by an increment $\Delta$Vpgm1 (first rate) while the slow down measure is applied to the even or odd bit lines. At PP=n+m+1, Vpgm is stepped down by an increment $\Delta$Vpgm2a (second rate). From PP=n+m+2 through PP=n+m+k, Vpgm is stepped up by an increment $\Delta$Vpgm3a (third rate). In one approach, |$\Delta$Vpgm2a|=Vbl-slow or slightly higher than Vbl-slow. This approach drops Vpgm in concert with the drop in Vbl for the bit lines which were subject to the slow down measure. In another approach, Vpgm is not stepped up on that program-verify iteration, as depicted in FIG. 15C2. In another approach, 0<$\Delta$Vpgm2b<$\Delta$Vpgm1 as depicted in FIG. 15C3. Other implementations are possible as well.

In FIG. 15C1, after Vpgm is stepped down for PP=n+m+1, Vpgm can continue to step upward, starting at PP=n+m+1. By using $\Delta$Vpgm3a>$\Delta$Vpgm1, we increase the programming speed relative to the period in which the slow down measure was applied, so that we can minimize the number of extra program pulses that may be required to complete programming. Since mainly the storage elements of the highest target data state have not yet reached lockout when $\Delta$Vpgm3a is used in this approach, it would only cause some widening on the upper tails of the Vth distributions for the highest target data state, but no loss of Vth window. This can be an acceptable tradeoff. By using this method, the final Vpgm can be same or very close to the nominal programming technique, and hence the amount of program disturb should be the same. By using an appropriate value of $\Delta$Vpgm3a, we can minimize the number of extra program pulses needed, or avoid any extra program pulses, and hence minimize or avoid a programming time penalty while still obtaining most of the benefit of reduced coupling for the target data states other than the highest target data state.

On the other hand, to limit the amount of Vth widening for the storage elements with the highest target state, we could step up Vpgm at the nominal pace, so that $\Delta$Vpgm3a=$\Delta$Vpgm1, at the cost of a longer programming time. Note that the Vth widening could occur generally for one or more of the highest target data states. The Vth widening occurs for the storage elements which have not yet reached the lockout condition.

Another option is to altogether exclude the storage elements which are programmed to the highest target data state from the slow down measure, since some Vth widening on the upper tail for these storage elements can often be tolerated. A benefit of this approach is that programming time is generally not increased since the programming time of a set of storage elements is typically controlled by the programming time of the storage elements which are programmed to the highest target data state.

FIG. 15C2 depicts a program pulse voltage versus program pulse number for use with the bit line voltages of FIG. 15B, where the program pulse voltage initially steps up at a first rate, then is fixed for one program pulse when the position-based slow down measure is removed, and then steps up at a second rate, higher than the first rate. The program pulses in the programming operation start at PP=1 with an initial level of Vpgm-init, and step up by an increment ΔVpgm1 (first rate) while the slow down measure is applied to the even or odd bit lines. At PP=n+m+1, Vpgm is the same as for PP=n+m. From PP=n+m+2 through PP=n+m+k, Vpgm is stepped up by an increment ΔVpgm3a (third rate).

FIG. 15C3 depicts a program pulse voltage versus program pulse number for use with the bit line voltages of FIG. 15B, where the program pulse voltage initially steps up at a first rate, then steps up for one program pulse at a second rate, lower than the first rate, when the position-based slow down measure is removed, and then steps up at a third rate, higher than the first rate. The program pulses in the programming operation start at PP=1 with an initial level of Vpgm-init, and step up by an increment ΔVpgm1 (first rate) while the slow down measure is applied to the even or odd bit lines. At PP=n+m+1, Vpgm is stepped up by an increment ΔVpgm2b (second rate). From PP=n+m+1 through PP=n+m+k, Vpgm is stepped up by an increment ΔVpgm3a>ΔVpgm2b (third rate).

Figure 15E:
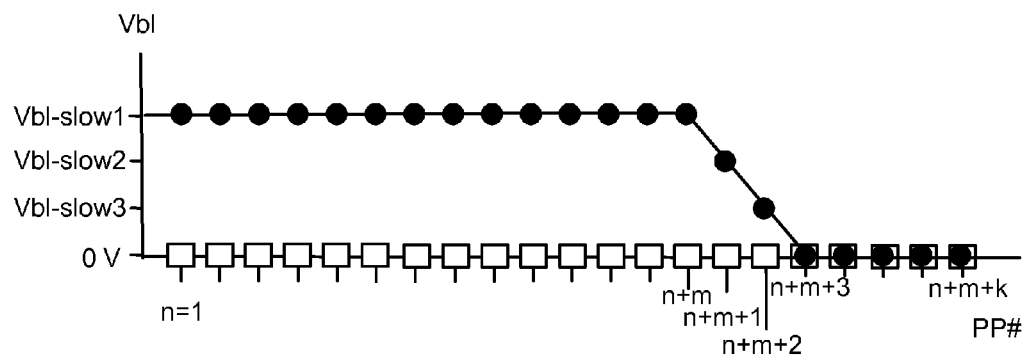
FIG. 15E depicts bit line voltages applied to even-numbered bit lines, for which no position-based slowdown measure is applied, and to odd-numbered bit lines, for which a position-based slowdown measure is applied, where the position-based slow down measure is removed incrementally over multiple program pulses before a programming operation is completed.

FIG. 15D depicts a program pulse voltage versus program pulse number for use with the bit line voltages of FIG. 15E, where the program pulse voltage initially steps up at a first rate, ΔVpgm1, then steps up for three program pulses at a second rate, ΔVpgm2b, lower than the first rate, when the position-based slow down measure is removed, and then steps up at a third rate, ΔVpgm3b, higher than the first and second rates. ΔVpgm3b may or may not be different than the previously-mentioned ΔVpgm3a. In one approach, ΔVpgm3b<ΔVpgm3a since the programming operation is slowed to a lesser extent when ΔVpgm2b is used than when ΔVpgm2a is used. This approach can be used, e.g., with the programming technique of FIG. 15E where the slow down measure is removed more gradually so that a step down in Vpgm to avoid a large jump in the Vth of the selected storage element at PP=n+m+1 is not needed. That is, a large jump in the Vth of the selected storage element at PP=n+m+1 can be avoided with a smaller Vpgm step size. In another option, ΔVpgm2b=0.

FIG. 15E depicts bit line voltages applied to even-numbered bit lines, for which no position-based slowdown measure is applied, and to odd-numbered bit lines, for which a position-based slowdown measure is applied, where the position-based slow down measure is removed incrementally over multiple program pulses before a programming operation is completed.

Instead of suddenly dropping Vbl from the full slow down level to 0 V, from one program pulse to the next, as in FIG. 15B, we could make the same transition more gradually over multiple program pulses. For example, if we use Vbl_slow=0.75 V, we can make the transition from 0.75 V to 0.50 V to 0.25 V to 0 V over successive program pulses, e.g., over the (n+m)th, (n+m+1)th, (n+m+2)th and (n+m+3)th program pulses. Generally, a transition over two or more program pulse is possible. This approach can keep programming time about the same as in the nominal programming technique while avoiding a drop in Vpgm at PP=n+m+1 and the subsequent increase in ΔVpgm described in connection with FIG. 15C1. In one approach, the Vpgm step size is kept constant throughout the programming operation. In another approach, Vpgm is stepped up by a lesser amount (e.g., by ΔVpgm2b) for PP=n+m+1, then increased again to ΔVpgm3b starting at PP=n+m+2, such as in FIG. 15C3.

In another option, depicted in FIG. 15D, Vpgm can be stepped up by ΔVpgm2b for each of the program pulses in which Vbl is stepped down, e.g., for PP=n+m+1 though n+m+3, then increased again to ΔVpgm3b starting at PP=n+m+4.

Optionally, to limit the amount of Vth widening for the storage elements with the highest target state, we could step up Vpgm at the nominal pace, so that ΔVpgm3b=ΔVpgm1, at the cost of a longer programming time.

Figure 15F:
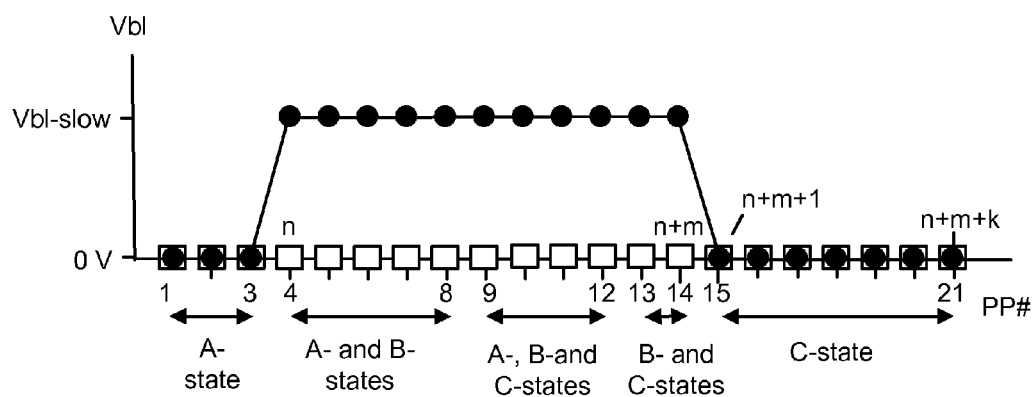
FIG. 15F depicts bit line voltages applied to even-numbered bit lines, for which no position-based slowdown measure is applied, and to odd-numbered bit lines, for which a position-based slowdown measure is applied, where the position-based slow down measure is started after an initial program pulse number, and removed before a programming operation is completed.

FIG. 15F depicts bit line voltages applied to even-numbered bit lines, for which no position-based slowdown measure is applied, and to odd-numbered bit lines, for which a position-based slowdown measure is applied, where the position-based slow down measure is started after an initial program pulse number, and removed before a programming operation is completed. As mentioned, the slow down measure can be applied for a range of program pulses which is less than all of the program pulses in a programming operation, and the range can have a start and/or stop which is fixed and/or adaptive. For instance, the first and last program pulses can be fixed according to one or more ROM fuse parameters. In an adaptive approach, the start and/or stop of the range is determined adaptively based on the progress of the programming operation.

Consider an example of full sequence programming as shown, where all target states are programmed in one programming operation. In an example scenario: (a) from PP=1-3, the A-state storage elements are programmed, (b) from PP=4-8, the A- and B-state storage elements are programmed, (c) from PP=9-12, the A-, B- and C-state storage elements are programmed, (d) from PP=13-14, the B- and C-state storage elements are programmed, and (e) from PP=15-21, the C-state storage elements are programmed. In the fixed approach, we could set n=4 and n+m=15, so that Vbl-slow is applied for m+1=11 program pulses, from PP=4-14.

In an adaptive approach, we can trigger the setting of Vbl-slow in a next program pulse (e.g., PP=4) after a program pulse (e.g., PP=3) in which we detect that at least a small number of B-state storage elements have reached the lockout condition. The small number could be one, or a few. This approach uses an adaptive trigger condition to dynamically determine a starting program loop for applying Vbl-slow. For all previous program pulses, e.g., PP=1-3, we can use 0 V on all bit lines or otherwise not apply a position based slow down measure. Moreover, since the number of storage elements locking out in the early few program pulses is small, the chance of a storage element experiencing the coupling effect from its neighboring storage element is also small. Thus we can still maintain most of the benefit of this scheme by delaying the use of Vbl-slow until after a few program pulses have been applied.

Alternatively, or additionally, we can trigger the removal or stepping down of Vbl-slow in a next program pulse (e.g., PP=15) after a program pulse (e.g., PP=14) in which we detect that nearly all of the B-state storage elements have reached the lockout condition. That is, no more than a small number of the B-state storage elements have not reached the lockout condition. Thus, the decision to step down from Vbl-slow can be made based on how many B-state storage elements are left to be locked out (or equivalently how many B-state storage elements are already locked out). A state-dependent bit-scan can be performed on each program pulse to find out how many storage elements of a particular state are left to be locked out, or have reached the lockout condition. Once the number is below some bit-ignore number, the Vbl transition from Vbl_slow to 0 V can be made. This approach uses an adaptive trigger condition to dynamically determine an ending program loop for removing Vbl-slow or stepping down from Vbl-slow.

An adaptive approach dynamically makes a transition decision for each programmed word line so that variations among word lines are automatically accommodated.

Figure 16:
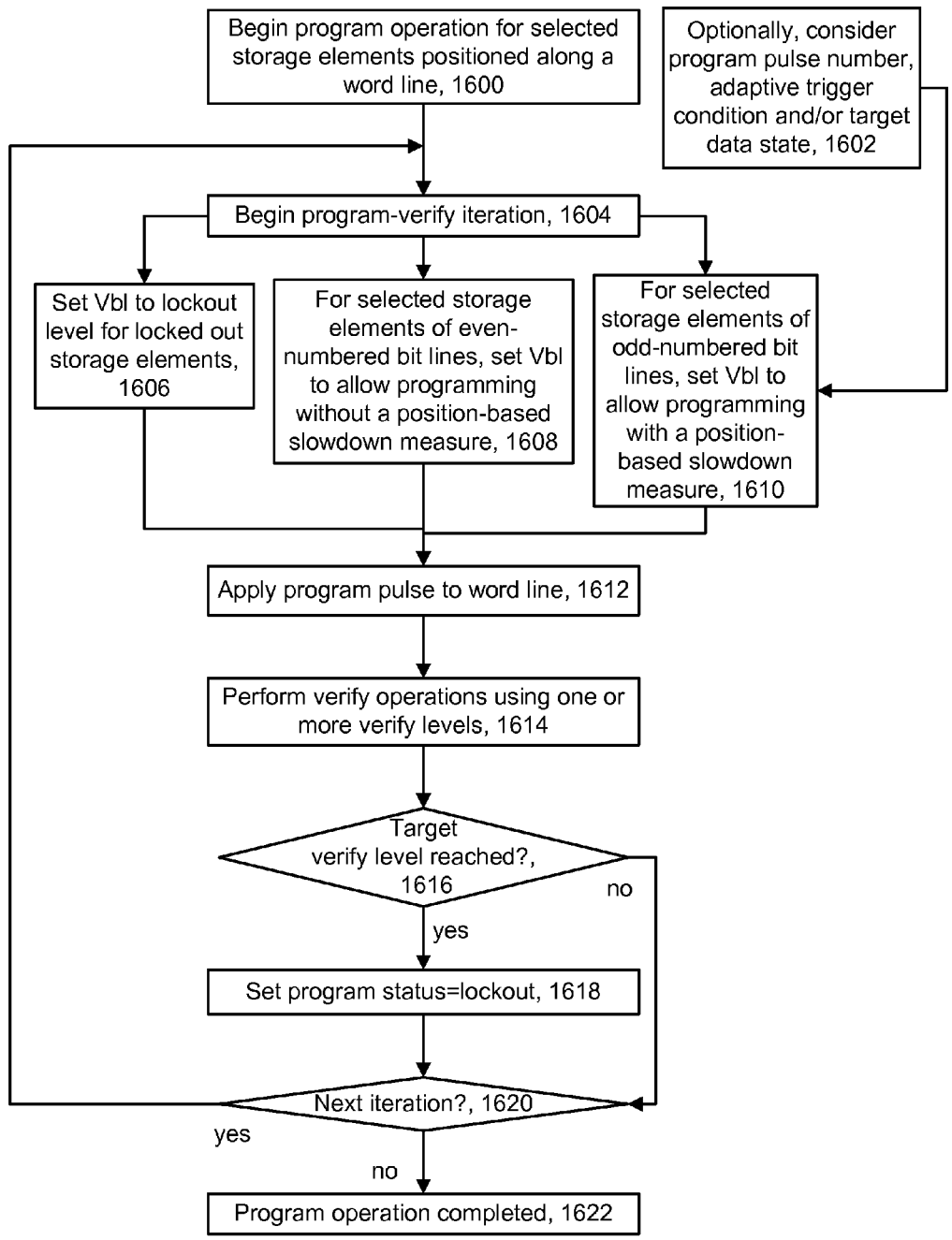
FIG. 16 depicts a process for programming selected storage elements in which a position-based slow down measure is applied to selected storage elements in a first set of positions along a word line, but not to selected storage elements in a second set of positions along the word line.

FIG. 16 depicts a process for programming selected storage elements in which a position-based slow down measure is applied to selected storage elements in a first set of positions along a word line, but not to selected storage elements in a second set of positions along the word line.

At step 1600, a program operation begins for selected storage elements positioned along a selected word line. At step 1604, a program-verify iteration begins. One of three paths can be followed for each storage element. In one path, step 1606 sets Vbl to a lockout level 1606, e.g., if the storage element has reached the lockout condition in a prior program-verify operation, or if the target state for storage element is erased state (E-state). In a second path, step 1608 sets Vbl for the selected storage elements which are not subject to the position-based slow down condition. For example, this can involve setting Vbl=0 V for the even-numbered bit lines.

In a third path, step 1610 sets Vbl for the selected storage elements which are subject to the position-based slow down condition. For example, this can involve setting Vbl=Vbl-slow for the odd-numbered bit lines. Step 1602 can be used as an input to step 1610 so that the decision to apply Vbl-slow is based on a fixed program pulse number, an adaptive trigger condition and/or a target data state. Regarding a target data state, the highest target data state can be excluded from being subject to the slow down measure, since some widening of the upper tail of the Vth distribution of the highest state can be tolerated in many cases, as mentioned.

Once the bit line voltages are set for all of the storage elements in communication with the word line, step 1612 applies a program pulse to the word line, and step 1614 performs verify operations using one or more verify levels. For each storage element, if the associated target verify level has been reached, at decision step 1616, a program status is set to lockout for the storage element. If a next program-verify iteration is to be performed, at decision step 1620, the process repeats starting at step 1604. If there is no next program-verify iteration of the programming operation at decision step 1620, the programming operation or pass is completed at step 1622. This will occur when all or most of the storage elements have reached their target verify levels, or else, if the program loop count exceeds the maximum number of allowed program-verify iterations.

Generally, a decision of whether to apply a slow down measure is based initially on a position of a storage element along a word line. Once it is determined that a storage element is eligible to receive a slow down measure, further decision-making criterion can be applied to determine whether to apply the slow down measure. For example, when the current program-verify iteration is an nth program-verify iteration, a decision can be made as to whether the nth program-verify iteration is within a specified range of program-verify iterations, where a number of program-verify iterations in the range is less than all program-verify iterations in the programming operation. In one approach, first and last program-verify iterations in the range of program-verify iterations are fixed.

In another approach, at least one of a first program-verify iteration of the range of program-verify iterations and a last program-verify iteration of the range of program-verify iterations is determined adaptively during the programming operation. In another approach, at least one of a first program-verify iteration of the range of program-verify iterations and a last program-verify iteration of the range of program-verify iterations is fixed by at least one ROM fuse.

Accordingly, it can be seen that a method for performing a programming operation for a set of non-volatile storage elements is provided, where the non-volatile storage elements are arranged in respective positions along a word line. The method includes performing a plurality of program-verify iterations, where each program-verify iteration includes a program portion in which a program pulse is applied to the word line. The method further includes, during the program portion of at least an ith program-verify iteration of the plurality of program-verify iterations, where i is an integer greater than zero, determining whether to subject at least one non-volatile storage element of the set which is not locked out from programming to a slow down measure based on a position of the at least one non-volatile storage element along the word line.

In another embodiment, a method of the above-mentioned type includes performing a plurality of program-verify iterations, where each program-verify iteration includes a program portion in which a program pulse is applied to the word line. The method further includes, during the program portion of nth through (n+m)th program-verify iterations of the plurality of program-verify iterations, where n and m are integers greater than zero, setting a voltage of a respective bit line which is associated with at least one non-volatile storage element of the set to a slow down level (Vbl-slow), above a ground level, based on a determination that a position of the at least one non-volatile storage element is in a first set of positions along the word line, where the first set of positions includes every other position along the word line, but fewer than all positions along the word line. The method further includes, during the program portion of one or more subsequent program-verify iterations of the plurality of program-verify iterations, setting the voltage of the respective bit line to at least one stepped down level (e.g., 0.75 V), lower than the slow down level, based on the determination that the position of the at least one non-volatile storage element is in the first set of positions along the word line.

In a corresponding embodiment, a non-volatile storage system includes a set of non-volatile storage elements, a word line in communication with the non-volatile storage elements, and a set of bit lines in communication with the non-volatile storage elements. The system further includes means for performing a plurality of program-verify iterations, where each program-verify iteration includes a program portion in which a program pulse is applied to the word line. The system further includes means for, during the program portion of nth through (n+m)th program-verify iterations of the plurality of program-verify iterations, where n and m are integers greater than zero, setting a voltage of a respective bit line which is associated with at least one non-volatile storage element of the set to a slow down level (Vbl-slow), above a ground level, based on a determination that a position of the at least one non-volatile storage element is in a first set of positions along the word line, where the first set of positions includes every other position along the word line, but fewer than all positions along the word line. The system further includes means for, during the program portion of one or more subsequent program-verify iterations of the plurality of program-verify iterations, setting the voltage of the respective bit line to at least one stepped down level (e.g., 0.75 V), lower than the slow down level, based on the determination that the position of the at least one non-volatile storage element is in the first set of positions along the word line.

In another embodiment, a method of the above-mentioned type includes performing a plurality of program-verify iterations, where each program-verify iteration includes a program portion in which a program pulse is applied to the word line. The method further includes, during the program portion of one of the plurality of program-verify iterations, setting a voltage of a respective bit line which is associated with at least one non-volatile storage element of the set to a slow down level, above a ground level, based on a determination that: (i) a position of the at least one non-volatile storage element is in a first set of positions along the word line, the first set of positions includes every other position along the word line, but fewer than all positions along the word line, (ii) the at least one non-volatile storage element has not yet reached a target data state, and (iii) the target data state is below a highest target data state of the non-volatile storage elements of the set.

In another embodiment, a non-volatile storage system includes a set of non-volatile storage elements, including at least adjacent first and second non-volatile storage elements which are to be programmed to one target verify level, a word line in communication with the non-volatile storage elements, a set of bit lines, the first and second non-volatile storage elements are associated with respective bit lines of the set of bit lines, and at least one control circuit. The at least one control circuit performs a programming operation which includes a plurality of program-verify iterations, and each program-verify iteration includes a program portion in which a program pulse is applied to the word line, where: (a) for nth through (n+m)th program-verify iterations of the plurality of program-verify iterations, where n and m are integers greater than zero, when the program pulse is applied to the word line, voltages are applied to the respective bit lines of the first and second non-volatile storage elements which are dependent on positions of the first and second non-volatile storage elements along the word line, and (b) for at least (n+m+1)th through (n+m+k)th program-verify iterations, where k is a number greater than one, when the program pulse is applied to the word line, voltages are applied to the respective bit lines of the first and second non-volatile storage elements which are independent of the positions of the first and second non-volatile storage elements along the word line.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for performing a programming operation for a set of non-volatile storage elements, the non-volatile storage elements are arranged in respective positions along a word line, the method comprising:
performing a plurality of program-verify iterations, each program-verify iteration comprises a program portion in which a program pulse is applied to the word line; and
during the program portion of at least an ith program-verify iteration of the plurality of program-verify iterations, where i is an integer greater than zero, determining whether to subject at least one non-volatile storage element of the set which is not locked out from programming to a slow down measure based on a position of the at least one non-volatile storage element along the word line, the at least one non-volatile storage element is not subjected to the slow down measure when the position of the at least one non-volatile storage element is in a first set of positions along the word line, the first set of positions comprises every other position along the word line, and the at least one non-volatile storage element is subjected to the slow down measure when the position of the at least one non-volatile storage element is in a second set of positions along the word line, the positions of the first set of positions are interleaved with the positions of the second set of positions.

2. The method of claim 1, wherein:
the determining whether to subject the at least one non-volatile storage element to the slow down measure is based on a position of the ith program-verify iteration among the plurality of program-verify iterations.

3. The method of claim 1, wherein:
the determining whether to subject the at least one non-volatile storage element to the slow down measure is based on whether the ith program-verify iteration is within a range of program-verify iterations among the plurality of program-verify iterations, a number of program-verify iterations in the range of program-verify iterations is less than a number of program-verify iterations in the plurality of program-verify iterations.

4. The method of claim 3, wherein:
first and last program-verify iterations in the range of program-verify iterations are fixed.

5. The method of claim 3, wherein:
at least one of a first program-verify iteration of the range of program-verify iterations or a last program-verify iteration of the range of program-verify iterations is determined adaptively during the programming operation.

6. The method of claim 3, wherein:
at least one of a first program-verify iteration of the range of program-verify iterations or a last program-verify iteration of the range of program-verify iterations is fixed by at least one ROM fuse.

7. The method of claim 1, wherein:
each non-volatile storage element is associated with a respective bit line;
the set of non-volatile storage elements is programming using all bit line programming; and
the at least one non-volatile storage element is subjected to the slow down measure by setting a voltage of a respective bit line which is associated with the at least one non-volatile storage element.

8. The method of claim 1, wherein:
each non-volatile storage element is in a respective NAND string.

9. The method of claim 1, wherein:
the determining whether to subject the at least one non-volatile storage element to the slow down measure is based on a target data state of the at least one non-volatile storage element.

10. The method of claim 9, wherein:
the at least one non-volatile storage element is excluded from being subjected to the slow down measure when the target data state is a highest target data state in the set of non-volatile storage element; and the at least one non-volatile storage element is not excluded from being subjected to the slow down measure when the target data state is not the highest target data state in the set of non-volatile storage element.

11. A method for performing a programming operation for a set of non-volatile storage elements, the non-volatile storage elements are arranged in respective positions along a word line, the method comprising:
performing a plurality of program-verify iterations, each program-verify iteration comprises a program portion in which a program pulse is applied to the word line; and
during the program portion of nth through (n+m)th program-verify iterations of the plurality of program-verify iterations, where n and m are integers greater than zero, setting a voltage of a respective bit line which is associated with at least one non-volatile storage element of the set to a slow down level, above a ground level, based on a determination that a position of the at least one non-volatile storage element is in a first set of positions along the word line, the first set of positions comprises every other position along the word line, but fewer than all positions along the word line; and
during the program portion of one or more subsequent program-verify iterations of the plurality of program-verify iterations, setting the voltage of the respective bit line to at least one stepped down level, lower than the slow down level, based on the determination that the position of the at least one non-volatile storage element is in the first set of positions along the word line.

12. The method of claim 11, wherein, based on the determination that the position of the at least one non-volatile storage element is in the first set of positions along the word line:
the voltage of the respective bit line is set to a stepped down level which is incrementally lower during program portions of each of a predetermined number of subsequent program-verify iterations following the (n+m)th program-verify iteration.

13. The method of claim 11, wherein, based on the determination that the position of the at least one non-volatile storage element is in the first set of positions along the word line:
the voltage of the respective bit line is set to a stepped down level which is incrementally lower during program portions of each of a predetermined number of subsequent program-verify iterations following the (n+m)th program-verify iteration, until a program-verify iteration in which the voltage of the respective bit line is set to 0 V, and
the voltage of the respective bit line is set to 0 V during a program portion of at least one additional program-verify iteration of the plurality of program-verify iterations.

14. The method of claim 11, wherein:
during the program portion of the one or more subsequent program-verify iterations, setting a voltage of a respective bit line which is associated with at least one other non-volatile storage element of the set to the ground level based on a determination that a position of the at least one other non-volatile storage element is in a second set of positions along the word line, the positions of the first set of positions are interleaved with the positions of the second set of positions.

15. A method for performing a programming operation for a set of non-volatile storage elements, the non-volatile storage elements are arranged in respective positions along a word line, the method comprising:
performing a plurality of program-verify iterations, each program-verify iteration comprises a program portion in which a program pulse is applied to the word line; and
during the program portion of one of the plurality of program-verify iterations, setting a voltage of a respective bit line which is associated with at least one non-volatile storage element of the set to a slow down level, above a ground level, based on a determination that: a position of the at least one non-volatile storage element is in a first set of positions along the word line, the first set of positions comprises every other position along the word line, but fewer than all positions along the word line, the at least one non-volatile storage element has not yet reached a target data state, and the target data state is below a highest target data state of the non-volatile storage elements of the set.

16. The method of claim 15, further comprising:
during the program portion, setting a voltage of a respective bit line which is associated with at least one other non-volatile storage element of the set to the ground level, the at least one other non-volatile storage element is in the first set of positions along the word line, based on a determination that a target data state of the at least one other non-volatile storage element is the highest target data state.

17. The method of claim 15, further comprising:
during the program portion, setting a voltage of a respective bit line which is associated with at least one other non-volatile storage element of the set to the ground level, based on a determination that a position of the at least one other non-volatile storage element is in a second set of positions along the word line, the positions of the first set of positions are interleaved with the positions of the second set of positions.

18. The method of claim 17, wherein:
a target data state of the at least one other non-volatile storage element is below the highest target data state.

19. An apparatus which performs the method of claim 15.

20. A non-volatile storage system, comprising:
a set of non-volatile storage elements, comprising at least adjacent first and second non-volatile storage elements which are to be programmed to one target verify level;
a word line in communication with the non-volatile storage elements;
a set of bit lines, the first and second non-volatile storage elements are associated with respective bit lines of the set of bit lines; and
at least one control circuit, the at least one control circuit performs a programming operation which comprises a plurality of program-verify iterations, each program-verify iteration comprises a program portion in which a program pulse is applied to the word line, where: for nth through (n+m)th program-verify iterations of the plurality of program-verify iterations, where n and m are integers greater than zero, when the program pulse is applied to the word line, voltages are applied to the respective bit lines of the first and second non-volatile storage elements which are dependent on positions of the first and second non-volatile storage elements along the word line, and for at least (n+m+1)th through (n+m+k)th program-verify iterations, where k is an integer greater than one, when the program pulse is applied to the word line, voltages are applied to the respective bit lines of the first and second non-volatile storage elements which are independent of the positions of the first and second non-volatile storage elements along the word line.

21. The non-volatile storage system of claim 20, wherein:
the program pulse is stepped up at a first rate for the nth through (n+m)th program-verify iterations, and is stepped down at a second rate for the (n+m+1)th program-verify iteration.

22. The non-volatile storage system of claim 21, wherein:
the program pulse is stepped up at a third rate, higher than the first rate, for (n+m+2)th through the (n+m+k)th program-verify iterations, where k is an integer greater than two.

23. The non-volatile storage system of claim 20, wherein the program pulse is:
stepped up at a first rate for the nth through (n+m)th program-verify iterations, is stepped down, or stepped up at a second rate which is lower than the first rate, for the (n+m+1)th program-verify iteration, and is stepped up at a third rate, higher than the first rate, for (n+m+2)th through the (n+m+k)th program-verify iterations.

24. The non-volatile storage system of claim 20, wherein:
the (n+m)th program-verify iteration is fixed.

25. The non-volatile storage system of claim 20, wherein:
the (n+m)th program-verify iteration is determined adaptively during the programming operation.

26. A non-volatile storage system, comprising:
a set of non-volatile storage elements;
a word line in communication with the non-volatile storage elements, the non-volatile storage elements are arranged in respective positions along the word line; and
at least one control circuit, the at least one control circuit performs a programming operation which comprises a plurality of program-verify iterations, each program-verify iteration comprises a program portion in which a program pulse is applied to the word line, where the at least one control circuit, during the program portion of at least an ith program-verify iteration of the plurality of program-verify iterations, where i is an integer greater than zero, determines whether to subject at least one non-volatile storage element of the set which is not locked out from programming to a slow down measure based on a position of the at least one non-volatile storage element along the word line, the at least one non-volatile storage element is not subjected to the slow down measure when the position of the at least one non-volatile storage element is in a first set of positions along the word line, the first set of positions comprises every other position along the word line, and the at least one non-volatile storage element is subjected to the slow down measure when the position of the at least one non-volatile storage element is in a second set of positions along the word line, the positions of the first set of positions are interleaved with the positions of the second set of positions.

* * * * *